(12) United States Patent
Locascio et al.

(10) Patent No.: US 8,236,480 B2
(45) Date of Patent: Aug. 7, 2012

(54) FABRICATION METHOD OF TOPOGRAPHICALLY MODULATED MICROSTRUCTURES USING PATTERN HOMOGENIZATION WITH UV LIGHT

(75) Inventors: Laurie E. Locascio, North Potomac, MD (US); Francisco Javier Atencia-Fernandez, Bethesda, MD (US); Susan Barnes, Raleigh, NC (US); Jack F. Douglas, Poolesville, MD (US)

(73) Assignee: The United States of America, as represented by the Secretary of Commere, the National Institute of Standards and Technology, Washington, DC (US)

( * ) Notice: Subject to any disclaimer, the term of this patent is extended or adjusted under 35 U.S.C. 154(b) by 1088 days.

(21) Appl. No.: 12/127,352

(22) Filed: May 27, 2008

(65) Prior Publication Data

US 2009/0155728 A1 Jun. 18, 2009

Related U.S. Application Data

(60) Provisional application No. 60/939,944, filed on May 24, 2007.

(51) Int. Cl.
*G03F 7/20* (2006.01)
(52) U.S. Cl. ........................................ 430/320; 430/396
(58) Field of Classification Search ........................ None
See application file for complete search history.

(56) References Cited

U.S. PATENT DOCUMENTS 5,310,623 A * 5/1994 Gal ................................. 430/321
2004/0132855 A1* 7/2004 Kohl et al. ..................... 522/150

OTHER PUBLICATIONS

Scaling and the design of miniaturized chemical-analysis systems Dirk Janasek, Joachim Franzke & Andreas Manz, Nature, vol. 442, Jul. 27, 2006, pp. 374-380.
Future lab-on-a-chip technologies for interrogating individual molecules Harold Craighead, Nature, vol. 442, Jul. 27, 2006, pp. 387-393.
Cells on chips, Jamil El-Ali, Peter K. Sorger & Klavs F. Jensen, Nature, vol. 442, Jul. 27, 2006, pp. 403-411.
Controlled microfluidic interfaces, Javier Atencia & David J. Beebe, Nature,vol. 437, Sep. 29, 2005, pp. 648-655.
Exposure characteristics and three-dimensional profiling of SU8C resist using electron beam lithography W. H. Wonga) and E. Y. B. Pun; accepted Mar. 5, 2001, J. Vac. Sci. Technol. B 19(3), May/Jun. 2001, pp. 732-735.
Sensors and Actuators 73, 1999. pp. 14-23 3D microfabrication by combining microstereolithography and thick resist UV lithography, A. Bertsch ), H. Lorenz, P. Renaud; accepted Oct. 7, 1998.
Focused ion beam induced deposition: fabrication of three-dimensional microstructures and Young's modulus of the deposited material, J. Micromech. Microeng. 10 (2000) 181-188.
Multilevel Microfluidics via Single-Exposure Photolithography, Michael W. Toepke and Paul J. A. Kenis; J. Am. Chem. Soc. 2005, 127, 7674-7675.
Fabricating multilevel SU-8 structures in a single photolithographic step using colored masking patterns J. Taff, Y. Kashte, V. Spinella-Mamo, and M. Paranjapea; accepted Jan. 9, 2006; published May 4, 2006. J. Vac. Sci. Technol. A 24,,3___, May/Jun. 2006.
General aspheric refractive micro-optics fabricated by optical lithography using a high energy beam sensitive glass gray-level mask, Walter Däschner,a) Pin Long, and Robert Stein, Chuck Wu, S. H. Lee; accepted Aug. 12, 1996, J. Vac. Sci. Technol. B 14(6), Nov./Dec. 1996.
Investigation of gray-scale technology for large area 3D silicon MEMS structures, Christopher M Waits, Alireza Modafe and Reza Ghodssi, in final form Dec. 11, 2002 Published Dec. 24, 2002, Journal of Micromechanics and Microengineering, 13 (2003) 170-177.
Reduction Photolithography Using Microlens Arrays: Applications in Gray Scale Photolithography Hongkai Wu, Teri W. Odom, and George M. Whitesides, Anal. Chem. 2002, 74, 3267-3273.
Gray-scale photolithography using microfluidic photomasks, Chihchen Chen, Danny Hirdes, and Albert Folch Edited by George M. Whitesides, Harvard University, Cambridge, MA, and approved Dec. 23, 2002 (received for review Sep. 23, 2002), PNAS, Feb. 18, 2003, vol. 100, No. 4, 1499-1504.
Multilevel Microfluidics via Single-Exposure Photolithography, Michael W. Toepke and Paul J. A. Kenis, J. Am. Chem. Soc. 2005, 127, 7674-7675.
Fabricating multilevel SU-8 structures in a single photolithographic step using colored masking patterns, J. Taff, Y. Kashte, V. Spinella-Mamo, and M. Paranjapea; accepted Jan. 9, 2006; published May 4, 2006, J. Vac. Sci. Technol. A 24(3), May/Jun. 2006, pp. 742-746.
Physical Review E vol. 47, No. 5 May 1993, Hydrodynamic friction of arbitrarily shaped Brownian particle, Joseph B. Hubbard, Jack F. Douglas.
Physics of Chemoreception, Howard C. Berg and Edward M. Purcell, BIophysical Journal vol. 20 1977, pp. 193-219.
Frontal Photopolymerization for Microfluidic Applications, João T. Cabral, Steven D. Hudson, Christopher Harrison, and Jack F. Douglas, In Final Form: May 6, 2004, FPP for Microfluidic Applications Langmuir, vol. 20, No. 23, 2004, pp. 10020-10029.

(Continued)

*Primary Examiner* — John A. McPherson
(74) *Attorney, Agent, or Firm* — Rankin, Hill & Clark LLP

(57) ABSTRACT

A method for microfabrication of a microfluidic device having sub-millimeter three dimensional relief structures is disclosed. In this method, homogeneous surfaces, which do not exhibit apparent pixel geometry, emerge from the interaction of the overlapping of diffracted light under opaque pixels and the nonlinear polymerization properties of the photoresist material. The method requires a single photolithographic step and allows for the fabrication of microstructures over large areas (centimeters) with topographic modulation of features smaller than 100 micrometers. The method generates topography that is useful in a broad range of microfluidic applications.

19 Claims, 17 Drawing Sheets

OTHER PUBLICATIONS

Propagating waves of network formation induced by light, J.T. Cabral, J.F. Douglas / Polymer 46 (2005) 4230-4241.

Rapid Prototyping of Microfluidic Systems in Poly(dimethylsiloxane) David C. Duffy, J. Cooper McDonald, Olivier J. A. Schueller, and George M. Whitesides, Anal. Chem. 1998, 70, 4974-4984.

Steady flow generation in microcirculatory systems, Javier Atencia and David J. Beebe, Accepted Jan. 6, 2006 First published as an Advance Article on the web Jan. 20, 2006, Lab Chip, 2006, 6, 567-574.

Passive Mixing in a Three-Dimensional Serpentine Microchannel, Robin H. Liu, Mark A. Stremler, Kendra V. Sharp, Michael G. Olsen, Juan G. Santiago, Ronald J. Adrian, Hassan Aref, and David J. Beebe, Journal of Microelectromechanical Systems, vol. 9, No. 2, Jun. 2000, pp. 190-197.

Rapid Microfluidic Mixing, Timothy J. Johnson, David Ross, and Laurie E. Locascio, Anal. Chem. 2002, 74, 45-51.

Chaotic Mixer for Microchannels, Abraham D. Stroock, Stephan K. W. Dertinger, Armand Ajdari, Igor Mezic, Howard A. Stone, George M. Whitesides, www.sciencemag.org Science vol. 295 Jan. 25, 2002, pp. 647-651.

Micromachined ultrasonic droplet generator based on a liquid horn structure, J. M. Meacham, C. Ejimofor, S. Kumar, F. L. Degertekin, and A. G. Fedorov, Review of Scientific Instruments vol. 75, No. 5 May 2004, pp. 1347-1352.

Optically-induced growth of fiber patterns into a photopolymerizable resin, Satoru Shoji and Satoshi Kawata, Applied Physics Letters vol. 75, No. 5 Aug. 2, 1999, pp. 737-739.

Nonlinear optical properties of photoresists for projection lithography, Anthony S. Kewitsch and Amnon Yariv, Appl. Phys. Lett. 68 (4), Jan. 22, 1996, pp. 455-457.

Nanoliter Microfluidic hybrid method for simultaneous screening and optimization validated with crystallization of membrane proteins, Liang Li, Debarshi Mustafi, Qiang Fu, Valentina Tereshko, Delai L. Chen, Joshua D. Tice, and Rustem F. Ismagilov, PNAS, Dec. 19, 2006, vol. 103, No. 551, 19243-19248.

Deterministic storage of liquid plugs in microfluidic channels using passive valves, Javier Atencia and Laurie E. Locascio, National Institute of Standards and Technology (NIST), USA (No date).

A microfluidic device based on droplet storage for screening solubility diagrams, Philippe Laval, Nocolas Lisai, Jean-Baptiste Salmon and Mathieu Joanicot, Lab Chip, 2007, 7, 829-834.

* cited by examiner

▲ Discrete pattern   ☐ Homogeneous pattern (nxa < 3000)

(nxa > 5500)

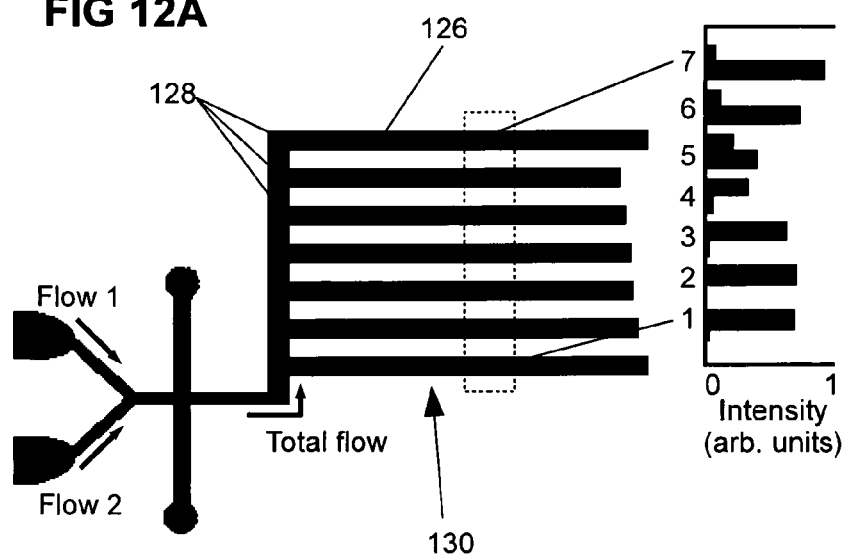
FIG 12A
FIG 12B
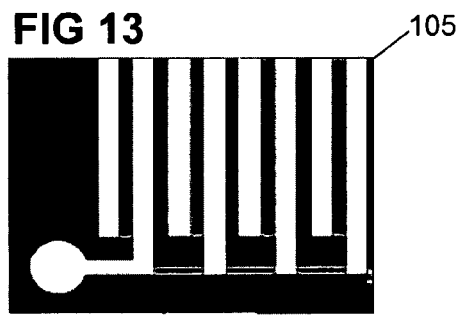
FIG 13
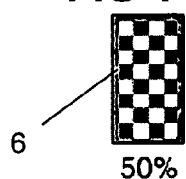
FIG 14
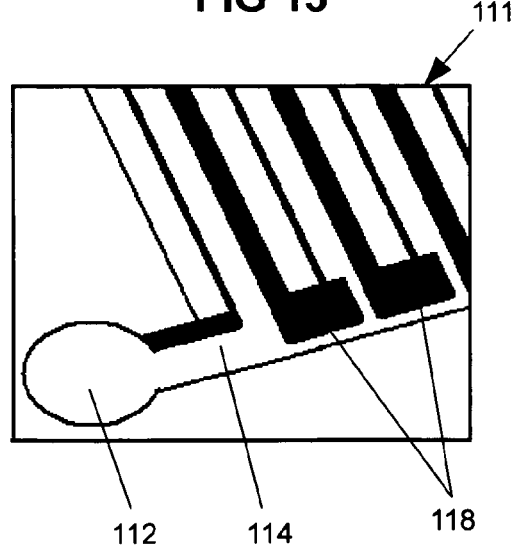
FIG 15

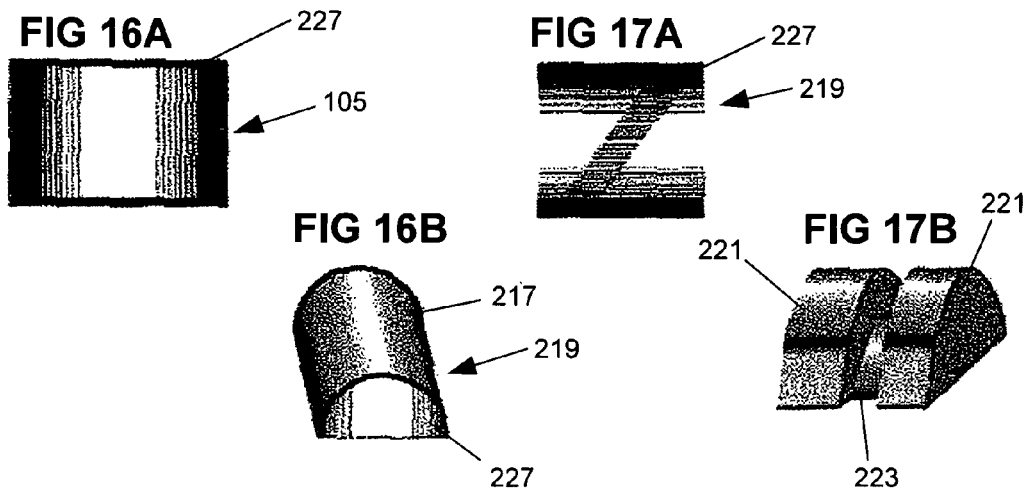
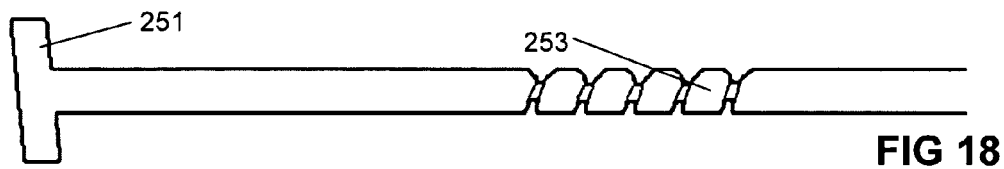
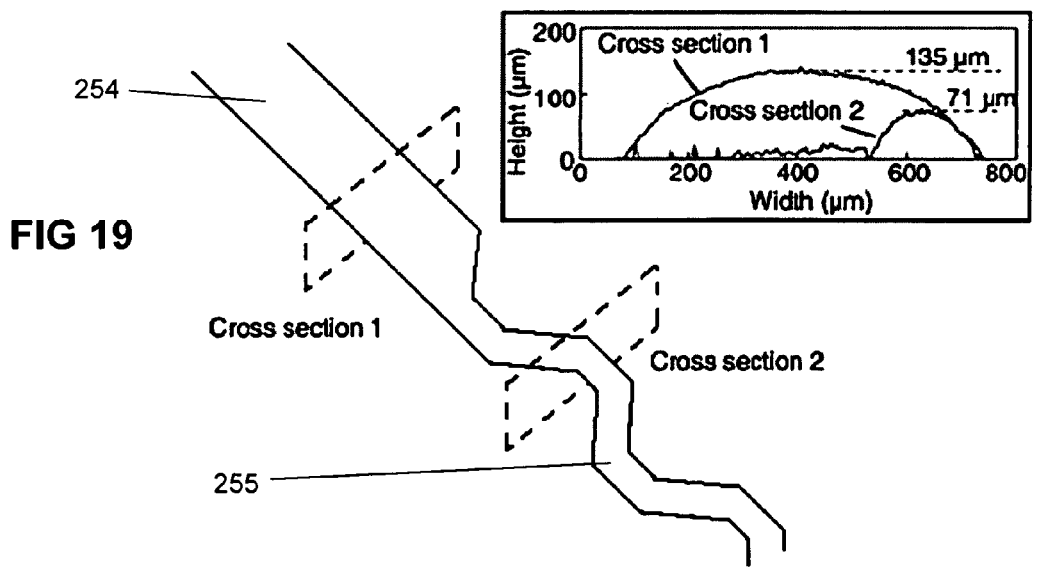

Jet ejection
FIG 27A
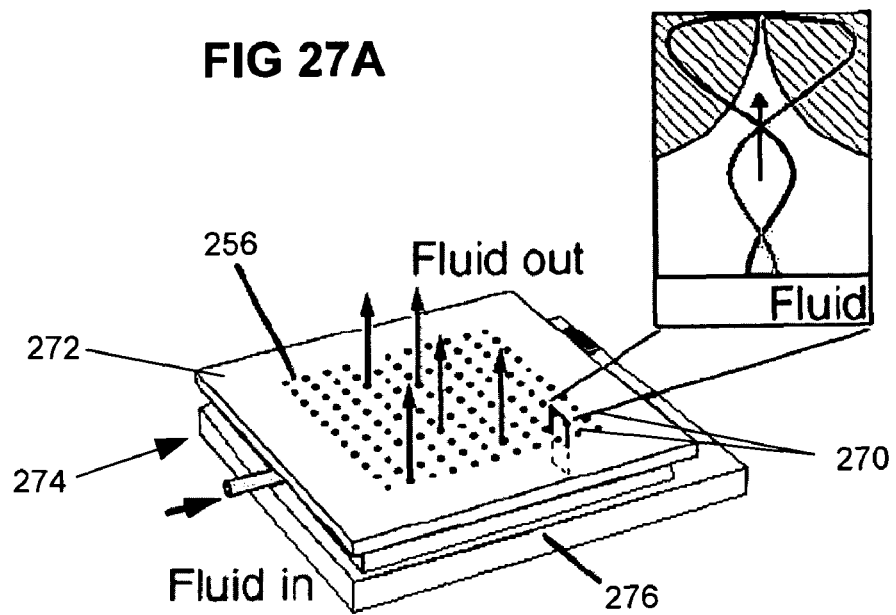
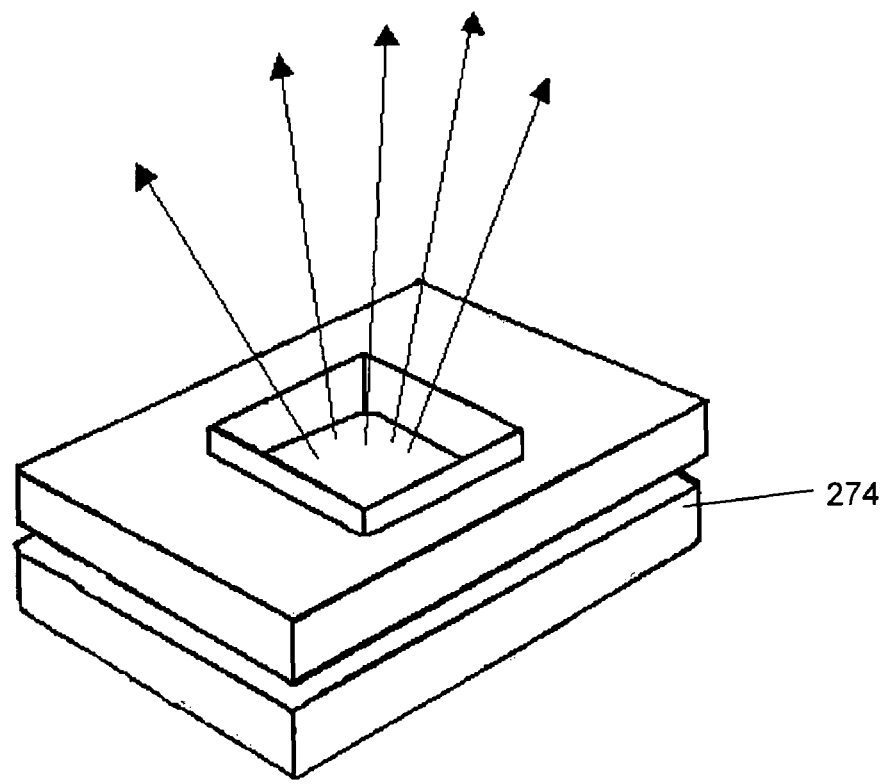
FIG 27B

FABRICATION METHOD OF TOPOGRAPHICALLY MODULATED MICROSTRUCTURES USING PATTERN HOMOGENIZATION WITH UV LIGHT

CROSS-REFERENCE TO RELATED APPLICATION

This application claims a benefit of priority under 35 USC §119 based on provisional patent application 60/939,944, filed May 24, 2007, the entire contents of which are hereby expressly incorporated by reference into the present application.

STATEMENT AS TO RIGHTS TO INVENTION(S) MADE UNDER FEDERALLY-SPONSORED RESEARCH AND DEVELOPMENT

The U.S. Government, through the National Institute of Standards and Testing (NIST), is the owner of this invention.

BACKGROUND OF THE INVENTION

1. Field of the Invention

The present invention relates in general to the field of the fabrication of microstructures. More particularly, the present invention relates to a fabrication method of topographically modulated microstructures using pixel grayscale pattern homogenization with UV light.

2. Discussion of the Related Art

Most engineered microfluidic systems are restricted to two dimensions with a modulation of width and length. Moreover, "pseudo" 3D microfluidic devices are typically fabricated by stacking microfluidic layers and interconnecting them as an extension of the fabrication processes, i.e., they have "3D" connections, but flat topography. Modulating the topography of microfluidic channels is interesting because the height is typically the smallest dimension, and becomes a crucial parameter for a number of microfluidic physical phenomena through its relation to the Reynolds number (Re). In particular, the Reynolds number is proportional to the characteristic length of the system. Additionally, two other parameters are significant; the capillary pressure, $P_c$, which is inversely proportional to the radius of curvature of the liquid-air interface, and the flow resistance, R, which scales as a cubic power of the smallest dimension in rectangular microchannels. Local control over these three parameters in a microchannel will facilitate taking advantage of inertial effects on the flow (manipulation of Re), programming the wetting flow inside a chip (manipulation of $P_c$), or designing flow patterns (manipulation of Re) to produce different local shear stresses, chaotic advection, etc.

There are several fabrication technologies based on optical methods that have been developed to micro-sculpt 3D structures with great precision, but they are generally ill-suited for patterning large areas for microfluidic applications because of the large cost and time required. Alternatively, there are a number of photolithographic "grayscale" approaches where a "grayscale" mask with modulated UV transmittance is used to control the spatial exposure dose of UV light onto the photoresist material. After development, these can exhibit smooth surfaces of different heights. In general, many of the known techniques require a compromise between resolution, cost, and complexity of fabrication and design.

Fabrication using true grayscale masks (as seen at www-.canyonmaterials.com) is particularly useful for the creation of high resolution 3D microstructures, but it is also expensive. Binary chrome masks are made of opaque and transparent pixels whose density determines the UV dose transmitted to produce 3D surfaces. Typically, these methods provide very good resolution at the expense of large amounts of processing that limit their practical use for patterning large areas. Additionally, a group at the University of Washington has demonstrated a fabrication method that uses ink flowing through microchannels to block UV light and pattern different heights correlated to the ink concentration in the aqueous solution. This method is useful for patterning large areas inexpensively and with virtually any tonality, but has limited flexibility to pattern arbitrarily sequential structures within those large areas. Alternative methods include the use of masks with opaque lines of different widths whose diffraction generates features of different heights, and the use of colored transparency masks with inks of different UV transmittance. In the first case, it is difficult to design a priori complex topographies because of the inherent complexity of diffraction. In the second case, the technique is limited by the available resolutions for colored transparencies. Other techniques are generally discussed in the article entitled "Using Pattern Homogenization of Binary Grayscale Masks to Fabricate Microfluidic Structures with 3D Topography," *Lab Chip*, 2007, 7, 1567-1573, which was published in August of 2007 by the Royal Society of Chemistry, the entire contents of which are hereby expressly incorporated by reference into the present application.

What is needed therefore is a microfluidic device and fabrication method that differs from conventional binary grayscale fabrication technology in its principle and its form so as to allow for the patterning of large areas with three dimensional (3D) relief structures within a range of dimensional sizes and resolutions. What is also needed is the ability to fabricate microfluidic devices with three dimensional (3D) topography to promote the emergence of new microfluidic functionalities. Further, what are needed are photopolymerizable materials with different viscosity, contrast, and grayscale homogenization threshold to allow for the fabrication of microfluidic channels and other microstructures within smaller size ranges.

SUMMARY AND OBJECTS OF THE INVENTION

By way of summary, the present invention is directed to a photolithographic technique for the fabrication of microstructures with arbitrary topography, which utilizes UV light and a binary transparency mask designed to trigger a homogenization effect on a photopolymer. This fabrication method allows for the fabrication of microstructures with modulated 3D topography over relatively large areas (centimeters) with typically a single photolithographic step.

The method preferably takes advantage of a homogenization transition that occurs in many natural phenomena consisting of the emergence of a continuum from the contribution of many discrete entities (see reference noted above for a discussion of specific examples). In one embodiment of the present invention, binary patterns on a mask are transferred as homogenous surfaces onto a photoresist using UV light. The fabrication of homogenous surfaces is greatly simplified by the adoption of sets of repetitive masking motifs functioning as "building blocks" and the surfaces form the three dimensional topographical structures.

This fabrication method differs from conventional binary grayscale fabrication technology in its principle (homogenization transition) and its form (hierarchical design approach). Thus, this fabrication method is particularly well-suited for patterning large areas with 3D relief structures within a range of dimensional sizes and resolutions, making it useful for many microfluidic applications. Such fabrication of microfluidic devices with 3D topography will promote the emergence of new microfluidic functionalities. Moreover, the use of certain photopolymerizable materials with different viscosity, contrast, and grayscale homogenization threshold will allow for the fabrication of microfluidic channels and other microstructures within smaller size ranges. Nanoparticles can also be incorporated to the photpolymerizable material to tune material properties such as conductivity, optical transparency, permeability, etc. [Cabral et al., *Polymer* vol. 46, 4230 (2005)]

In one embodiment, the steps of the inventive method preferably include first providing a mask with transparent and opaque pixels, e.g., a binary transparency mask. Then a photoresist material is provided, preferably with an optical adhesive having low contrast, e.g., $\gamma \approx 0.55$. Next, a glass slide is provided and the photoresist material is subjected to UV energy to promote polymerization. Partial polymerization occurs in areas of the photoresist that are subject to diffracted light from the mask. In this manner, patterns are transferred from the mask as preferably homogeneous patterns or discrete pixel patterns to the photoresist material.

In one embodiment, at least one three dimensional microchannel is created in the photoresist. Other three dimensional microstructures, such as at least one inlet and one outlet, can be formed to create a functional microfluidic device. This method of fabricating the microfluidic device allows for the production of a variety of such microstructures with modulated topography over large areas.

Tiling pattern units, such as swatches, may be preferably utilized as repetitive motifs to define areas that transmit the same level of UV intensity from the mask and UV light to the photoresist. Swatches may also be used to provide for a distinct array of pixels where the relative density of transparent to opaque pixels determines the average UV light intensity transmitted. In one example, a swatch is created with 8×4 pixels that differ in average grayscale tone or pixel size. A circle in the mask is then tiled with an 8×4 swatch. Alternatively, 8×4 pixel swatches are combined with 5×1 swatches to produce a microchannel with a zigzag structure that is modulated in an x, y, and z direction. Further, a plurality of swatches may be used as building blocks in a hierarchical design approach to create other complex polymerized patterns in the microfluidic device. Exposing the photoresist to just enough UV light so that the polymer at the surface is in a compliant gel-like state and sticks to itself aids in smoothing the transitions between surfaces of similar heights.

Graphic software can be conveniently utilized to form lines in the grayscale. These lines facilitate the formation of a variety of other shapes, such as semicircular microchannels by using swatches of 5×1 pixels. The complexity of the microchannel can be enhanced with additional graphic software operations such as stretching, rotating, and skewing.

In one embodiment, the mask is formed with an array of circles filled with different patterns. In this way, a combinatorial set of polymerized structures is fabricated.

An array of polymerized horns may be created by the inventive method. These may then be used to form a microfluidic device with ejectors configured to monodisperse liquid droplets.

A first level and a second level may also be created on the photoresist. For example, the first level here has multilevel microchannels or other curved surfaces and the second level includes a large rectangle.

Another 3D microchannel may be created by skewing a second pattern 30 degrees from a first pattern and then overlaying the second pattern on top of the first pattern to obtain a semi-circular microchannel with a semi-spiral ridge inside.

Other microstructures, like curved surfaces, are created by designing incremental grayscale tones in adjacent small areas.

These and other aspects and objects of the present invention will be better appreciated and understood when considered in conjunction with the following description and the accompanying drawings. It should be understood, however, that the following description, while indicating preferred embodiments of the present invention, is given by way of illustration and not of limitation. Many changes and modifications may be made within the scope of the present invention without departing from the spirit thereof, and the invention includes all such modifications.

BRIEF DESCRIPTION OF THE DRAWINGS

A clear conception of the advantages and features constituting the present invention, and of the construction and operation of typical mechanisms provided with the present invention, will become more readily apparent by referring to the exemplary, and therefore non-limiting, embodiments illustrated in the drawings accompanying and forming a part of this specification, wherein like reference numerals designate the same elements in the several views, and in which:

FIGS. 12A and 12B illustrate fluid flow in the device shown in FIG. 6;

FIG. 13 is a partial view of a grayscale pattern used to create a microfluidic device;

FIG. 14 is a swatch used to create the grayscale pattern of FIG. 13;

FIG. 15 is a partial close-up view of microchannels of the device created using the grayscale shown in FIG. 13;

FIGS. 16A-17B illustrate other grayscale patterns and the shapes may form;

FIG. 18 shows a partial view T-shaped microchannel formed using the method of the present invention;

FIG. 19 shows a close up of a zigzag section of microchannel formed using the method of the present invention;

FIG. 27A is an illustration showing an ejector device in operation;

FIG. 27B is a photograph showing that ejector device of the present invention in operation;

Figure 1:
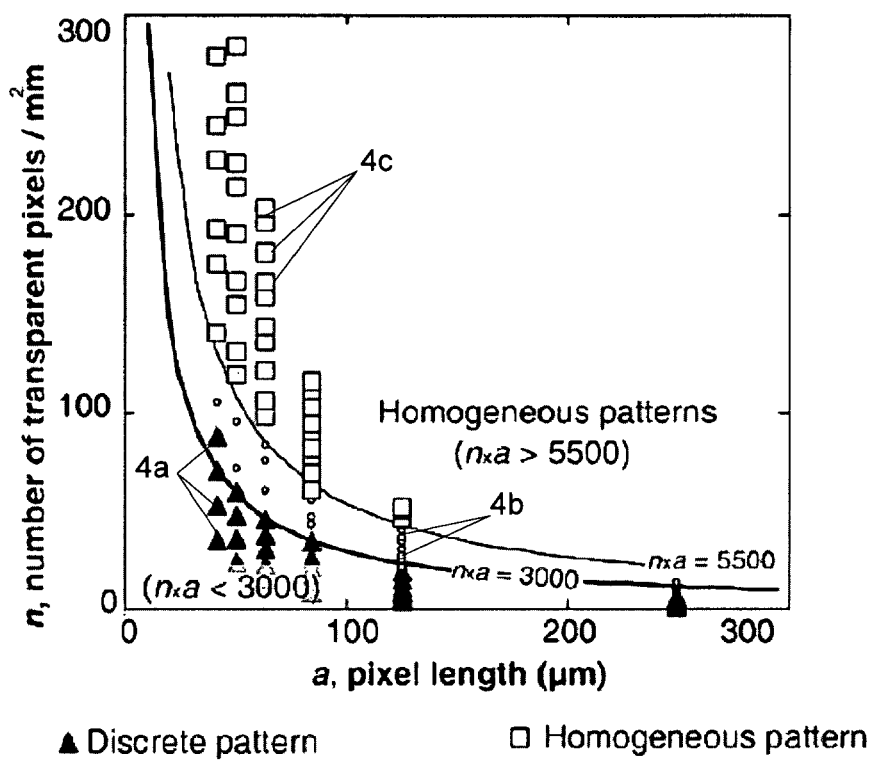
FIG. 1 is an illustration of morphology transition in an array of swatches of different pixels size and density.

In describing the preferred embodiment of the invention that is illustrated in the drawings, specific terminology will be resorted to for the sake of clarity. However, it is not intended that the invention be limited to the specific terms so selected and it is to be understood that each specific term includes all technical equivalents that operate in a similar manner to accomplish a similar purpose. For example, the words "connected", "attached", or terms similar thereto are often used. They are not limited to direct connection, but include connection through other elements where such connection is recognized as being equivalent by those skilled in the art.

DESCRIPTION OF PREFERRED EMBODIMENTS

The present invention and the various features and advantageous details thereof are explained more fully with reference to the non-limiting embodiments described in detail in the following description.

1. System Overview

In the method of the present invention, first a glass slide is brought into contact with an optical adhesive of a photoresist chip. A mask with grayscale patterns is then used to block UV light selectively from the photoresist chip. This method promotes partial polymerization on the chip in areas subject to diffracted light. It also facilitates the transfer of discrete patterns from the mask to the photoresist chip as homogeneous patterns (smooth surfaces). Specifically, under an opaque pixel, there is an overlapping of the exponential decay in intensity from each edge (due to diffraction) that, in addition to the low contrast of the photoresist and the non-linear interaction of photopolymerized features can eventually trigger the emergence of a continuous polymerized structure.

To control this nonlinear collective phenomenon, tiling pattern units or "swatches" are used as repetitive motifs to define areas that transmit the same level of UV intensity. Each swatch is a distinct array of pixels where the relative density of transparent to opaque pixels determines the average UV light intensity transmitted (see, e.g., FIG. 28).

Preferably, the device created is a microfluidic device that has a main channel with several constrictions that alternate with dead-end side microchannels.

In another example, curved surfaces may also be created by designing incremental grayscale tones in adjacent small areas. This may be accomplished because after the first exposure to UV light, the polymer at the surface is in a compliant gel-like state that can stick to itself during cleaning, smoothing the transitions between surfaces of similar heights. Moreover, semicircular microchannels have been generated by using swatches of 5×1 pixels that are further enlarged with graphic-design software.

In yet another example, 8×4 pixel swatches are combined for multilevel flat surfaces with 5×1 swatches. These may produce a microchannel with a zigzag structure that is modulated in the three x, y, and z directions.

Similarly, swatches with different hierarchical levels may be used to design complex micro fluidic devices. Typically, the first level defines the grayscale tones for simple geometries such as the ones considered in the previous examples, and the subsequent levels increase the degree of complexity. An illustration of this is an array of polymerized "horns" that is fabricated and used as a master for a microfluidic device that ejects monodisperse liquid droplets into air.

It should be noted that all of the patterns described herein may be combined to form a single microfluidic device. Further, all of the microstructures described herein may be combined into one microfluidic device.

Some of the advantages of the inventive method include (i) ease of design; (ii) fast turn-around times both for mask design and fabrication based solely on exposure times; (iii) low cost of transparency masks, i.e., about $15 US Dollars; and (iv) patterning of large areas and single structures simultaneously with topographic resolutions of tens of microns. With this method, the mask pixels can be significantly larger than the optical resolution of the system, which is key to patterning large areas with inexpensive transparency masks and conventional photolithographic equipment.

2. Detailed Description of Preferred Embodiments

Specific embodiments of the present invention will now be further described by the following, non-limiting examples which will serve to illustrate various features of significance. The examples are intended merely to facilitate an understanding of ways in which the present invention may be practiced and to further enable those of skill in the art to practice the present invention. Accordingly, the examples should not be construed as limiting the scope of the present invention.

Figure 2:
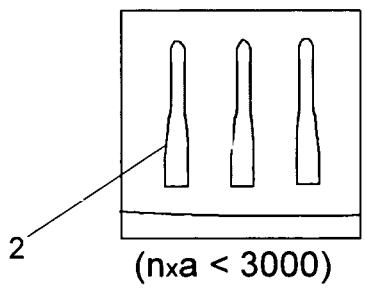
FIG. 2 and the FIG. 3 illustrate various shapes produced.
Figure 3:
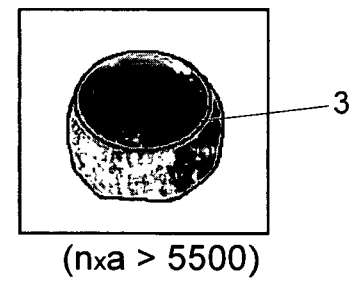

FIG. 1 shows a diagram of the morphology transition in an array of cylinders (2 mm diameter) that is created with masks patterned with variable pixel size and pixel density. A photoresistive adhesive polymerizes forming individual posts $4a$ (▲) and 12 as shown in FIG. 2 or homogeneous macro surfaces $4c$ (□) and 3 as shown in FIG. 3 depending on the number of transparent pixels per unit area of the patterned mask (n) and the size of a pixel (a). The number of transparent pixels/mm$_2$ is represented as "n" and "a" is pixel lenghth (μm) The reference number $4b$ (○) denotes transition cases between homogenous and discrete patterns. For further details see also FIG. 29. Interestingly, it was found that small individual posts (≈30 μm) generated with transparent pixels in swatches are vertical and form long threads, probably due to a lensing effect. Such complex geometries are useful for many applications such as to create tailored 3D flow patterns inside the microchannel to promote chaotic advection. Further, they may be used to create arbitrary cross sections in the microchannel that yield in plane velocity profiles different than Poiseuille flow for pressure driven systems. Finally, they may be used to modify the cross sectional distribution of the electric field in electro-osmotic flow to eliminate electric field constriction.

Figure 4:
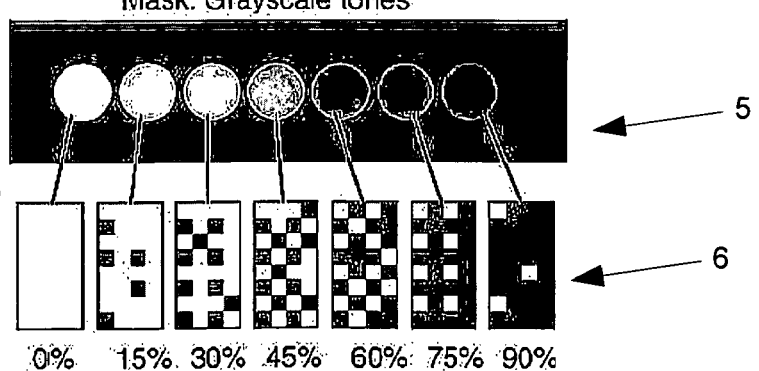
FIG. 4 illustrates various grayscale tones in swatches which may be used.
Figure 34:
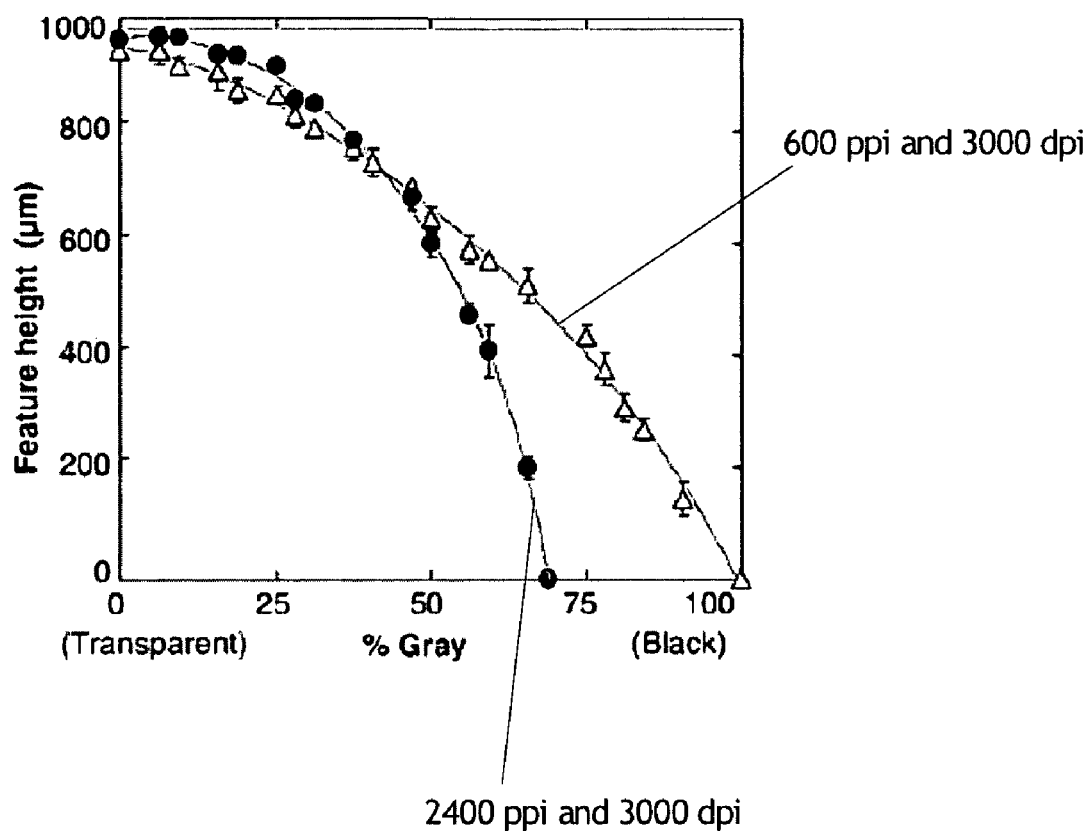
FIG. 34 is a graph showing a calculation method of the present invention.

FIG. 4 shows a grayscale illustration 5 with corresponding pixel patterns or swatches 6. It should be noted that experimental data shows the correlation between the height of macro-surfaces and grayscale tone in two experiments (see, e.g., FIGS. 28 and 29, and graph shown in FIG. 34), with patterns at 600 ppi (pixels per inch) (●) and 2400 ppi (Δ) and in both cases at 3000 dpi (dots per inch) printing resolution. Pixels per inch, "ppi," is used for pixel size when referring to the resolution of the pixelation process when converting theoretical grayscale into black and white pixels to distinguish it from the printing resolution or mask resolution that is given in "dpi" (dots per inch). The lines in FIG. 34 are a fit to guide the eye. The in-plane resolution is given by the size of the swatch used and by the minimum spacing required between features to avoid partial polymerization. Using 8×4 swatches at 2400 ppi (and 3000 dpi) the minimum area size that can be patterned is 42×84 µm². Below 2400 ppi, the optical resolution of the experimental photolithographic setup interferes with the fidelity of the patterns. It was discovered empirically that the optical adhesive polymerizes forming vertical "threads" of 1 to 2 µm diameter, which sets the ultimate in-plane resolution of the fabrication process with this material if higher resolution masks are employed. Using ink masks printed at 3000 dpi and the optical adhesive, the smallest reproducible feature fabricated was a microchannel of constant height of 60 µm±3 µm along the symmetry axis.

Figure 5:
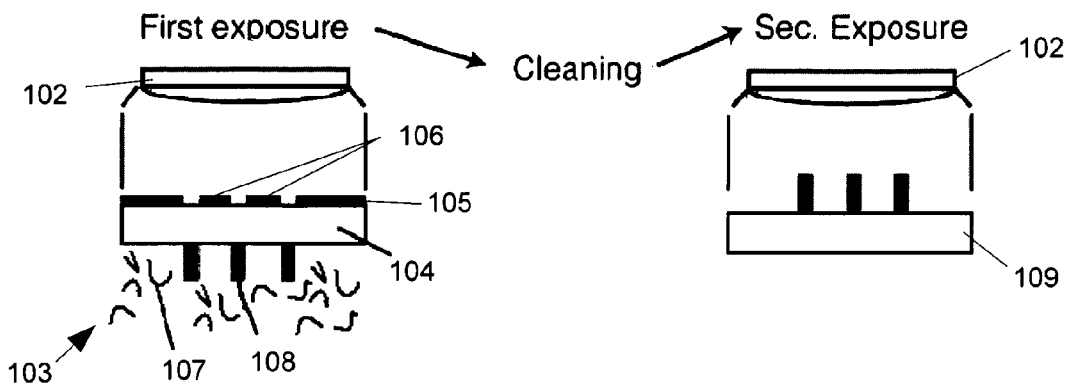
FIG. 5 is a schematic illustrating fabrication of a master template.

FIG. 5 shows one embodiment of the method present invention. Using grayscale fabrication, a photoresist material 103 is exposed to UV light 102 through a binary transparency mask 105. In between the mask 105 and the photoresist material 103 is preferably a glass slide 104. The mask 105 preferably has a plurality of transparent and opaque pixels which form patterns used to fabricate microstructures with modulated topography over large areas. Large groups of pixels or "swatches" are needed for more complex shapes. The photoresist material used is an optical adhesive 107 with low contrast $\gamma \approx 0.55$. Contrast is a measure of the ability of a resist to distinguish between transparent and opaque areas of a mask and typical photoresists have a contrast of 2 to 3. At least partial polymerization of the material 103 occurs to create polymerized microstructures 108. It should be noted that the photolithographic contrast is the maximum slope of the plot of development rate versus exposure dose on a logarithmic scale. The contrast of optical adhesion is calculated by collecting data on the following: 1) the calculation of the position of the polymerization front as a function of time; and 2) an accurate knowledge of the light intensity at the surface of the optical adhesive.

The transmittance of light through grayscale patterns becomes increasingly nonlinear as the pattern pixel size approaches the printing resolution of the mask. As will be discussed further below, the entire process needed to be calibrated instead of using higher resolution masks to increase pattern fidelity.

Figure 6:
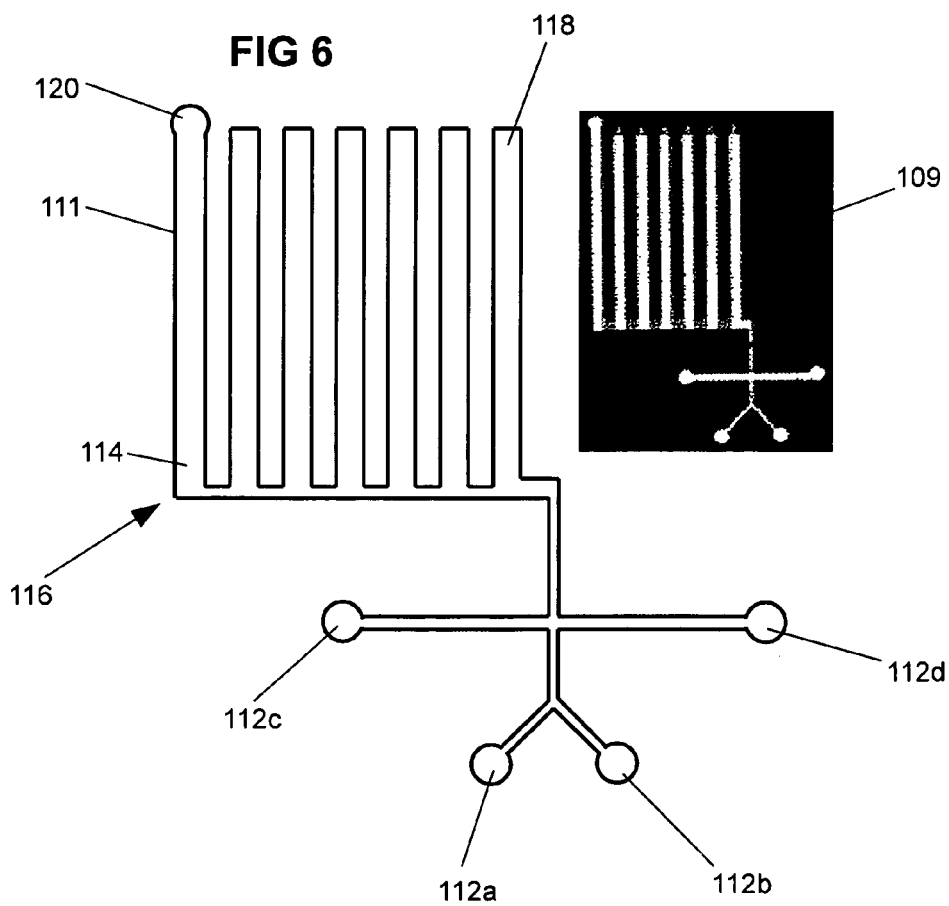
FIG. 6 shows a microfluidic device fabricated by the inventive method.

FIG. 6 shows an embodiment including a multilevel microfluidic device 111 of the present invention preferably used for the deterministic storage of liquid plugs using capillary forces. Replica molding is also used for the fabrication of this microfluidic device. First, a thiolene master or template 109 is created (see insert shown next to FIG. 6). This is done with grayscale transparency mask 105 as discussed above. However, the mask uses 8×4 swatches (see, e.g., FIG. 8 and 9) of pixels. The swatches create in the device 111 at least one multilevel microchannel 114 that is able to harness capillarity forces and store fluid in a deterministic way (see, e.g., FIG. 12A).

Figure 10:
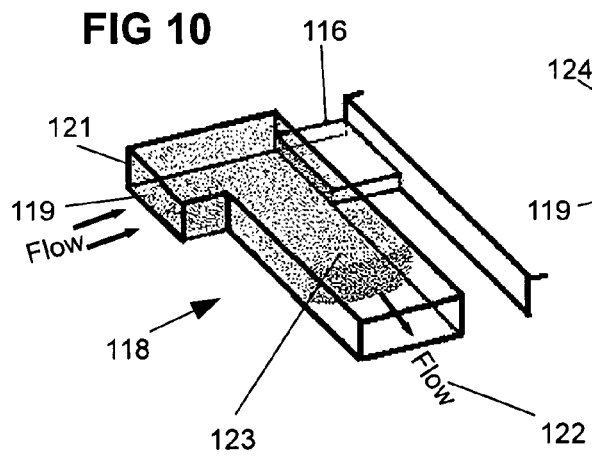
FIGS. 10 and 11 are schematics of side channels of the device shown in FIG. 6.
Figure 11:
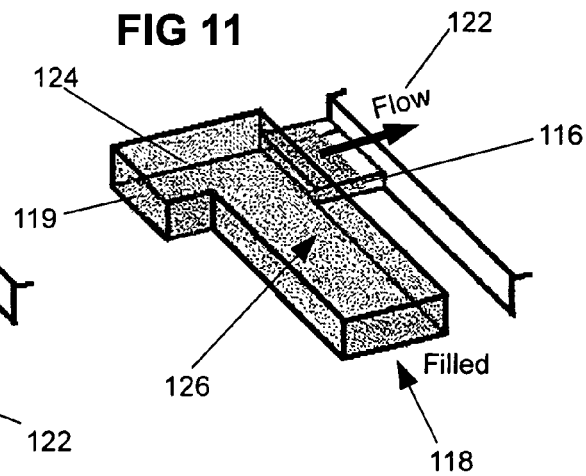

The preferred microfluidic device or chip 111 has four inlets 112a-112d as shown in FIG. 6. These inlets 112a-d merge into the main microchannel 114. The microchannel 114 preferably includes topographic constrictions 116 that alternate with dead-end side microchannels 118. Preferably, at least one outlet 120 is provided on the chip 111. As best shown in FIGS. 10 and 11, each constriction 116 is designed to stop a priming flow through the main channel 114, using capillary forces until the previous side channel 118 is completely filled and a plug of liquid is stored. Consequently, this device 111 may be used to create libraries of liquid plugs with arbitrary concentrations of liquids, e.g., dilute chemicals.

Figure 7:
FIG. 7 is a close-up of a microchannel of the device shown in FIG. 6.
Figure 8:
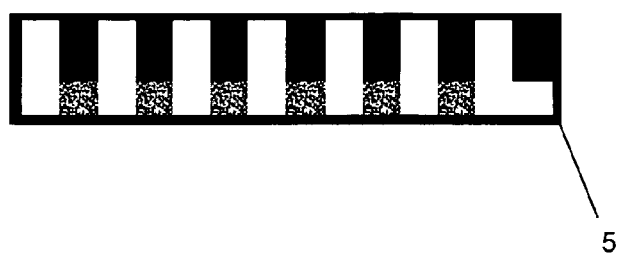
FIG. 8 is a grayscale pattern used to create the microchannel shown in FIG. 7.
Figure 9:
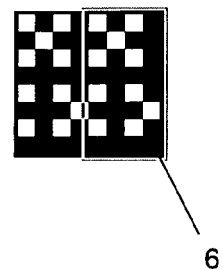
FIG. 9 is a swatch used to create the grayscale pattern of FIG. 8.

FIG. 7 shows a detail on a bottom of the device 111 including the main microchannel 114. FIG. 8 is a grayscale pattern 5 used to construct the microchannel 114. FIG. 9 is an 8×4 swatch 6, e.g., a 70% grayscale pattern, used for the constrictions 116.

FIG. 10 is a schematic showing the typical operation of the microfluidic device 111. A liquid is introduced through an inlet and moves along the main microchannel. It then comes to an inlet 119 to the side channel 118. The pressure that must be overcome by the moving the liquid front is higher at the constriction 116 than at the side microchannels 118, and, therefore, the side channels 118 fill first before the liquid moves on. The quantity of liquid contained in a channel is often referred to as a plug of liquid 126.

It should be noted that the maximum capillary force preventing a liquid front from wetting hydrophobic walls is proportional to the perimeter of the interface, and is given (if the microchannel is rectangular and all walls are hydrophobic) by $F_c = \gamma \cos(\theta) \times 2(w+h)$, where $\gamma$ is the surface tension of the liquid, $\theta$ is the contact angle (we assume the same contact angle for all walls), w is the width of the channel and h is the height of the channel. If a pressure $\Delta P$ is applied to the liquid plug 126 in order to move it, the advancing interface will be subject to a force proportional to the area of the interface $F_{ad} = \Delta P \times (w \times h)$. The plug starts moving when $F_{ad} > F_c$ thus, $F_{ad}/F_c > 1$, which can be expressed as: $(w \times h)/(w+h) > 2 \gamma \cos(\theta)/\Delta P$. If the height of the microchannel is reduced by a factor n, then $$(w \times h/n)/(w+h/n) = (w \times h)/(n \times w + h) < (w \times h)/(w+h), \forall n > 1$$

and, therefore, the pressure threshold to start moving a liquid front in rectangular hydrophobic microchannels is higher in small channels or constrictions. Thus, as shown in FIG. 11, the liquid enters a constriction 116 only after filling the previous side channel.

As shown in FIG. 12A, deterministic combinatorial storage of fluidic libraries 130 is illustrated by using two syringe pumps simultaneously to deliver two different color dyes and to store them in closed compartments (side channels 118) of the device 111. The delivery rate of both dyes is ramped inversely, with 100% red and 0% blue at the beginning and 0% red and 100% blue at the end. The different combinatorial concentrations are stored passively in the different compartments. The external programmable syringe pumps introduce a red and blue dye through inlets 1 and 2, respectively, in FIG. 12A. Both flow rates are ramped with the same slope and opposite sign, thus maintaining a constant total flow rate through the main channel 114 throughout priming. The liquid with variable dye concentrations is stored sequentially in the side channels 118. This yielded an array 128 with a color gradient that varied within each side microchannel 118 and between microchannels. This illustration thus shows that it is possible for complex mixtures to be a) generated and stored in such a chip for applications such as chemotaxis experiments under zero-flow conditions, or b) dispersed in immiscible liquid forming droplets for combinatorial experiments and stored deterministically for subsequent analysis.

Referring now to FIGS. 13-15 another possible embodiment of the microfluidic device 111 is shown. As shown in FIG. 13, a grayscale pattern on a mask 105 is created. The mask 105 preferably is constructed using 8×4 swatches 6 like the one shown in FIG. 14. FIG. 15 shows a close-up of the device 111 created. The device 111 includes an inlet 112, a main microchannel 114, and a plurality of side channels 118.

Referring to FIGS. 16A-17B, in this embodiment of the device 111, curved surfaces are generated with a single grayscale mask. For example, as shown in FIG. 16A, the mask 105 is created with first-level 5×1 swatches (arrays of 5×1 transparent and opaque pixels) that are elongated along the length of the microchannel to form lines 227. The complexity of the curved surface 227 is then increased with simple graphic operations such as stretching, rotating, and skewing (graphics software may be used here). For example, a second pattern of lines may be used to generate a microchannel of smaller diameter. Here, after a first pattern is created, a second pattern is created by skewing the first pattern by 30 degrees. Then, the second pattern is overlaid on top of the first pattern to obtain a semi-circular micro channel 219 with a semi-spiral ridge inside. The resulting two axis symmetric grayscale gradients end up defining curved sides of the microchannel as shown in FIG. 16B. In FIGS. 17A and 17B, the same type of patterns are then used to create a microchannel 223 of smaller diameter then the rest of the microchannel 221. The original is first skewed and overlaid on top of the patterns of the previous panel, rendering a single semi-spiral ridge. In the embodiment shown in FIG. 18, the patterns in FIGS. 16A-17B were repeated several times along the main channel to build a "T" main microchannel 251 with a semi-screw mixer 253. This is accomplished with a single mask.

In the example seen in FIG. 19, the mixing part of the "T" microchannel is modified to introduce simultaneous modulation in the x, y, and z directions (i.e., a so-called zigzag pattern 225). As shown by the inset cross-section, the channel 254 goes from a larger diameter to a smaller diameter. The minimum spacing between patterns necessary to generate such stepped flat surfaces is also the area required as a transition between steps, and can be calculated with the sidewall angle and the height difference between steps. A sidewall angle of approximately 85 degrees is created from medium-low grayscale tones. Grayscale tones close to the homogenization threshold generate surfaces with lower sidewall angles that may vary depending on the pattern.

Figure 20:
FIG. 20 is a partial view of a grayscale used to create the microchannel of FIG. 19.
Figure 21:
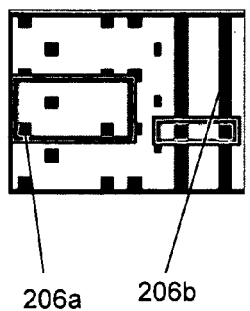
FIG. 21 is a swatch used to create the grayscale pattern of FIG. 20.

FIG. 20 shows a pattern 205 that may be used to create such a channel 254. FIG. 21 shows a detail of an 8×4 swatch 206a (10%) and a 5×1 swatch 206b (60%) used to make such a pattern master 205. As mentioned, once the method of the present invention has created a three dimensional microfluidic device, the device may be used to create libraries of liquid plugs with arbitrary concentrations of chemicals, cells, etc.

The homogenization phenomenon is further enhanced by designing a mask with an array of circles filled with different patterns to fabricate a combinatorial set of polymerized structures. Each circle in the mask may be tiled with a different 8×4 swatch (swatch formed by 8×4 pixels), that differ in either average "grayscale tone" (the ratio of transparent to opaque pixels where 0% is completely transparent and 100% completely opaque) or in pixel size. Again as shown in FIG. 1, it was discovered that there is a transition where binary patterns on the mask are transferred to the photoresist as homogeneous polymerized patterns, or discrete polymerized patterns where the pixel geometry is apparent (e.g., one post per pixel). Interestingly, this transition does not depend on pixel density but instead is found to occur for a critical value of the product of n×a, where n is the number of transparent pixels per unit area, and a is the side length of the pixel. Specifically, if n×a>5500 μm per unit of patterned area (in mm²), the pattern is transferred as a homogeneous smooth surface (this condition may be referred to as the "grayscale homogenization threshold"). Further, if n×a<3000 μm/mm², it is transferred as a collection of discrete pixelated patterns (FIG. 2). Thus, while the relation between grayscale tone and polymerized feature height is reproducible, it may be complex to predict. Nevertheless, as shown in FIG. 34 a simple calibration method may be used to empirically determine this relation for a set of swatches and design microfluidic devices a posteriori. For example, each swatch produces a specific photopolymerized structure of a distinct height, and, therefore, they may be used as building blocks in a hierarchical design approach for the creation of complex polymerized patterns within the device. In this way, multilevel flat features can be easily fabricated by designing adjacent large areas with swatches of different grayscale tones.

Figure 22:
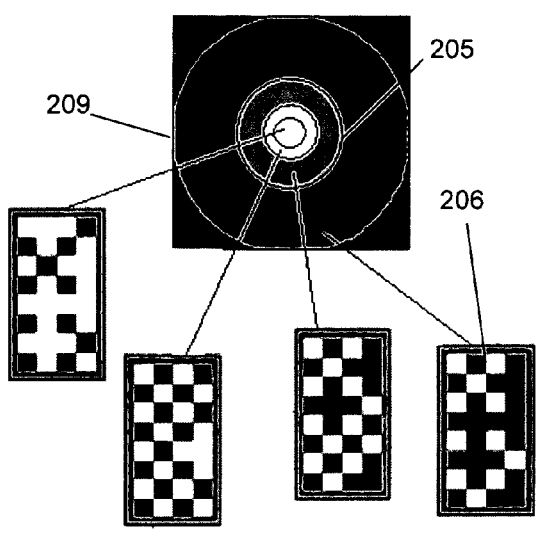
FIG. 22 shows a close-up of a concentric circle pattern formed using the method of the present invention.
Figure 23:
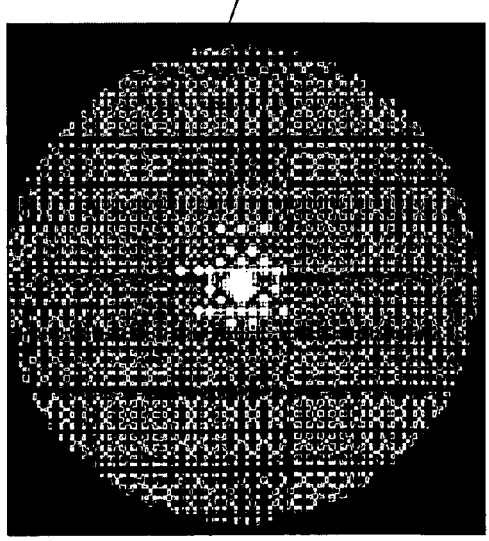
FIG. 23 is a pixelated grayscale pattern of FIG. 22.
Figure 24:
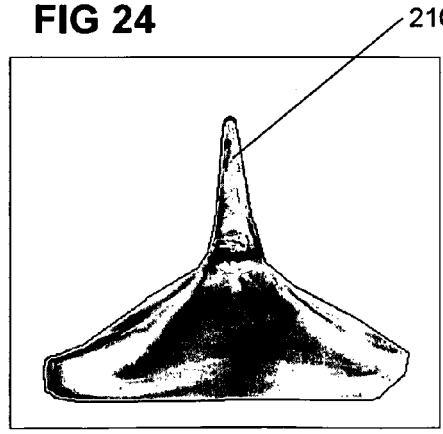
FIG. 24 is a horn created using the pattern shown in the FIG. 23.
Figure 25A:
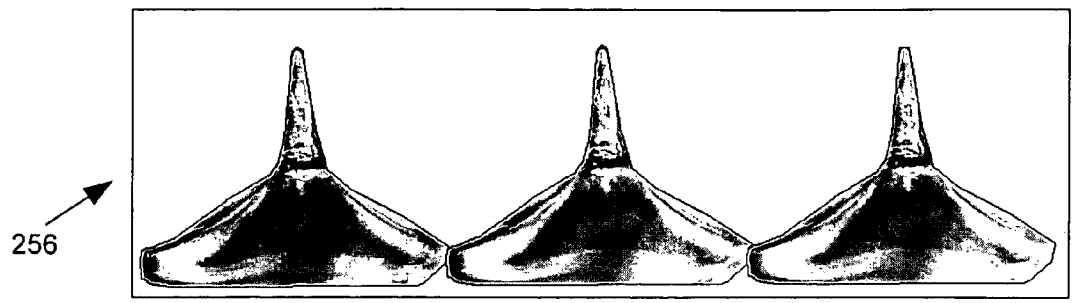
FIG. 25A is a master template of horns like the one shown in FIG. 24.

FIGS. 22-24, show an embodiment of the present invention utilizing hierarchical patterning. FIG. 22 shows a compound of concentric circles 209 of different grayscale tones in pattern 205. The 8×4 swatches 206 below from left to right correspond to a 35%, 45%, 60%, and 65% grayscale tone. FIG. 23 shows a mask design 207 pixilated using first-level 8×4 swatches 206. First, a horn 210 is constructed from concentric circles 209 patterned with different tonalities of first-level grayscale 8×4 swatches. Such a single horn 210 is shown in FIG. 24. In any event, the circles 209 vary monotonically from black in the outer circle (1 mm outer diameter) to white in the inner circle (50 μm diameter), as shown in FIG. 22. Next, this design is used to define a second-level swatch, and apply it to pattern a large rectangle with the same repetitive motif as shown in FIG. 25A to create a master. Additional first-level swatches may be added to the design to generate multilevel micro channels or other curved surfaces. Alternatively, the master horn pattern 256 may be used to construct microfluidic ejectors 270, shown in FIG. 27A.

Fabrication of the ejectors 270 is as follows: an adhesive 262 is poured over the master 256, next a glass slide 264 with a thick membrane of polydimethylsiloxan (PDMS) 266 is pressed against the master 256 and the adhesive 262 is exposed to a UV light 261. When both sides are pressed together, the tips of the horns are inserted into the soft PDMS layer 266 to form an ejector plate 272. Thus, the horn cavities 269 created on one side of the sandwiched membrane end up in orifices that surface on the other side of the membrane. Next the completed membrane or ejector plate 272 is released from the master. The membrane with the horn cavities 269 connecting both sides is used as an ejector plate.

Figure 26:
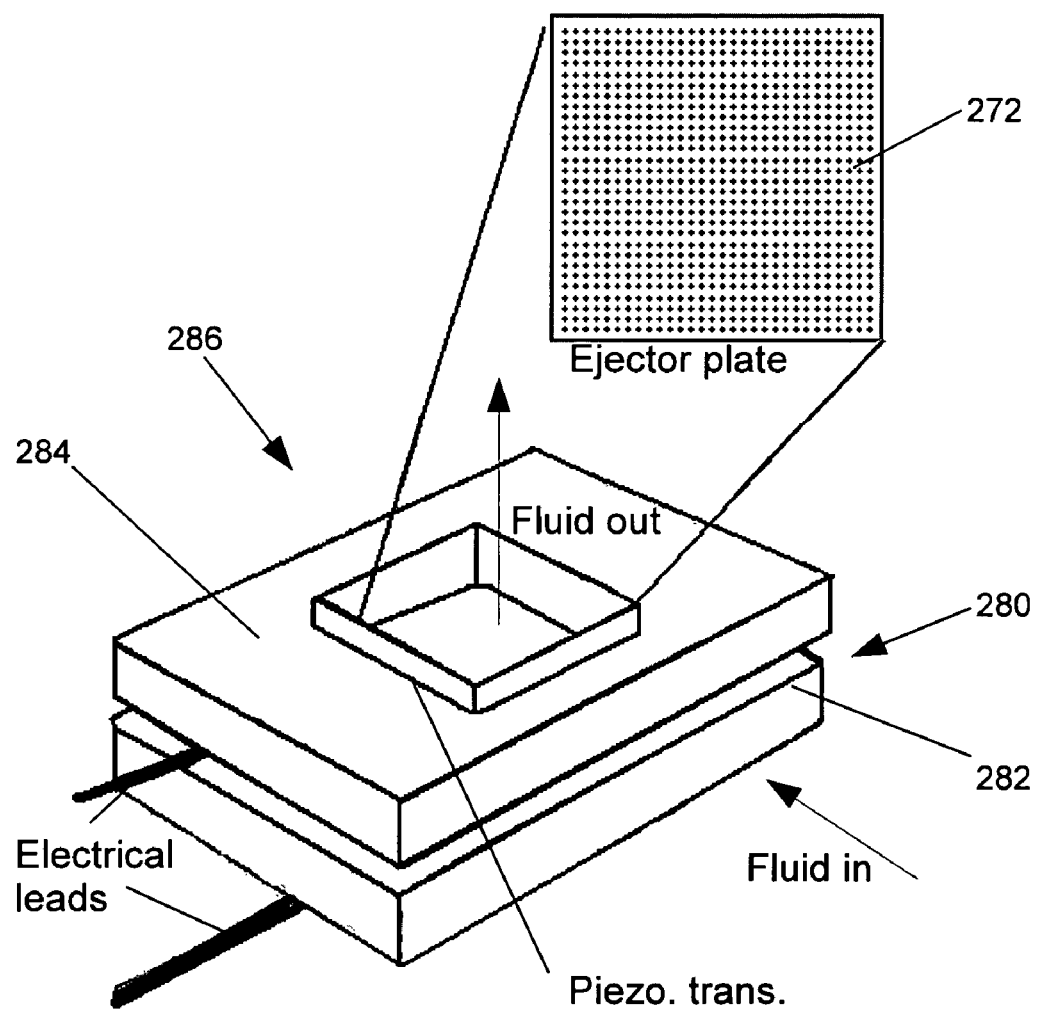
FIG. 26 shows an ejector device of the present invention.

A prototype of an atomizer 274 with an ejector plate 272 is shown in FIG. 26. The plate 272 is mounted over a PDMS gasket 282 and piezoelectric actuator 284. These are then assembled between pieces of aluminum and polycarbonate to form a sandwich structure 286 around a fluid cavity, as shown in FIG. 26.

To operate the ejector, the fluid cavity is primed with water. A sinusoidal AC voltage signal is then generated by a function generator provided by Stanford Research Systems DS345 and an RF amplifier provided by T&C Power Conversion AG1020. When it is operated at a specific frequency (e.g. from 0.8 to 1.1 MHz), the piezoelectric transducer 276 produces standing acoustic waves that are focused by geometrical reflections within the horns, creating a pressure gradient that can be used for fluid jet ejection. The resulting micro fluidic device 274 may be used to eject liquids, such as water, through the thiolene nozzle orifices at ≈5 ml/min flow rate (see, e.g., FIG. 27A and 27B). Moreover, the diameter of the nozzle orifices (40 μm) is well suited to cell manipulation via focused mechanical forces to enable various biophysical effects such as the uptake of small molecules and gene delivery and transfection. Additionally, the grayscale mask here may be designed to create nozzle orifices of different sizes for application to areas as diverse as mass spectrometry, fuel processing, manufacture of multilayer parts and circuits, and photoresist deposition without spinning.

Figure 25B:
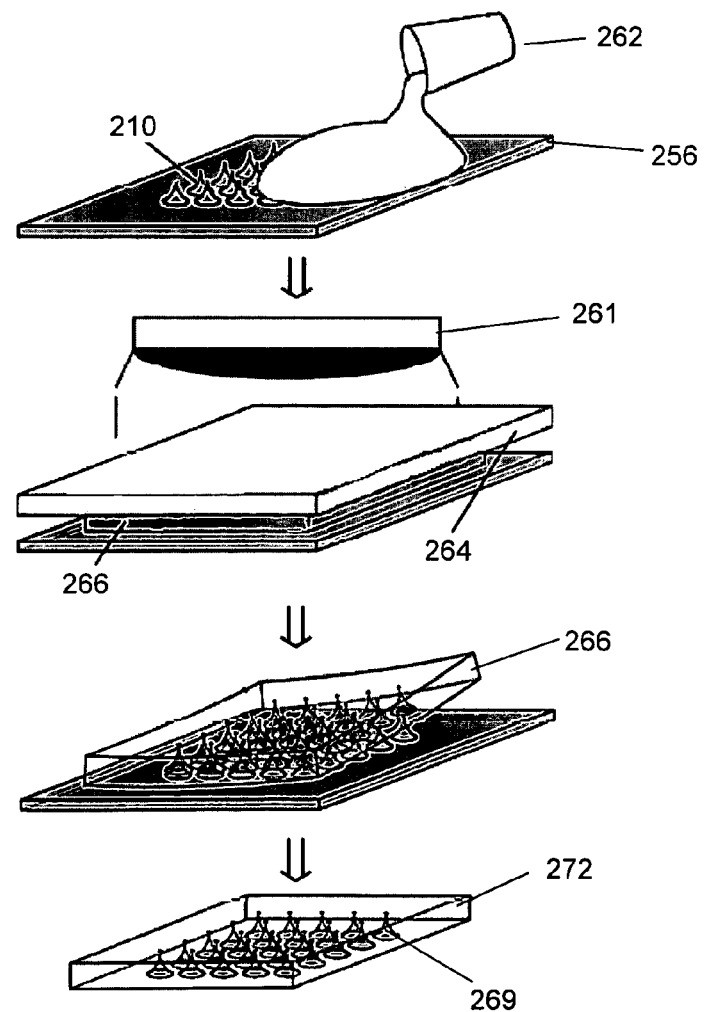
FIG. 25B shows a method of creating an ejector plate from the template shown in FIG. 25A.

FIG. 25A illustrates the result when the design of a single horn shown in FIG. 24 is used as a second-level swatch to pattern a large rectangular area (20 mm$^2$×20 mm$^2$). After fabrication, this swatch pattern may be used to generate an array of thiolene horns. As shown in FIG. 25B, these horns then may be used as a template to replicate repetitive cavities and form an ejector plate (see, e.g., FIG. 26).

FIG. 26 shows a microfluidic device including the ejector formed from the array of horns. FIG. 27A shows a schematic illustrating the operation of an ultrasonic atomizer created using a method of the present invention. Here fluid enters the chamber through a capillary. When the piezoelectric transducer is driven at a resonant frequency of the chamber, pressure wave focusing leads to ejection of jets of liquid. FIGS. 27A and 27B both show a demonstration of jet ejection with a microfluidic.

Figure 28:
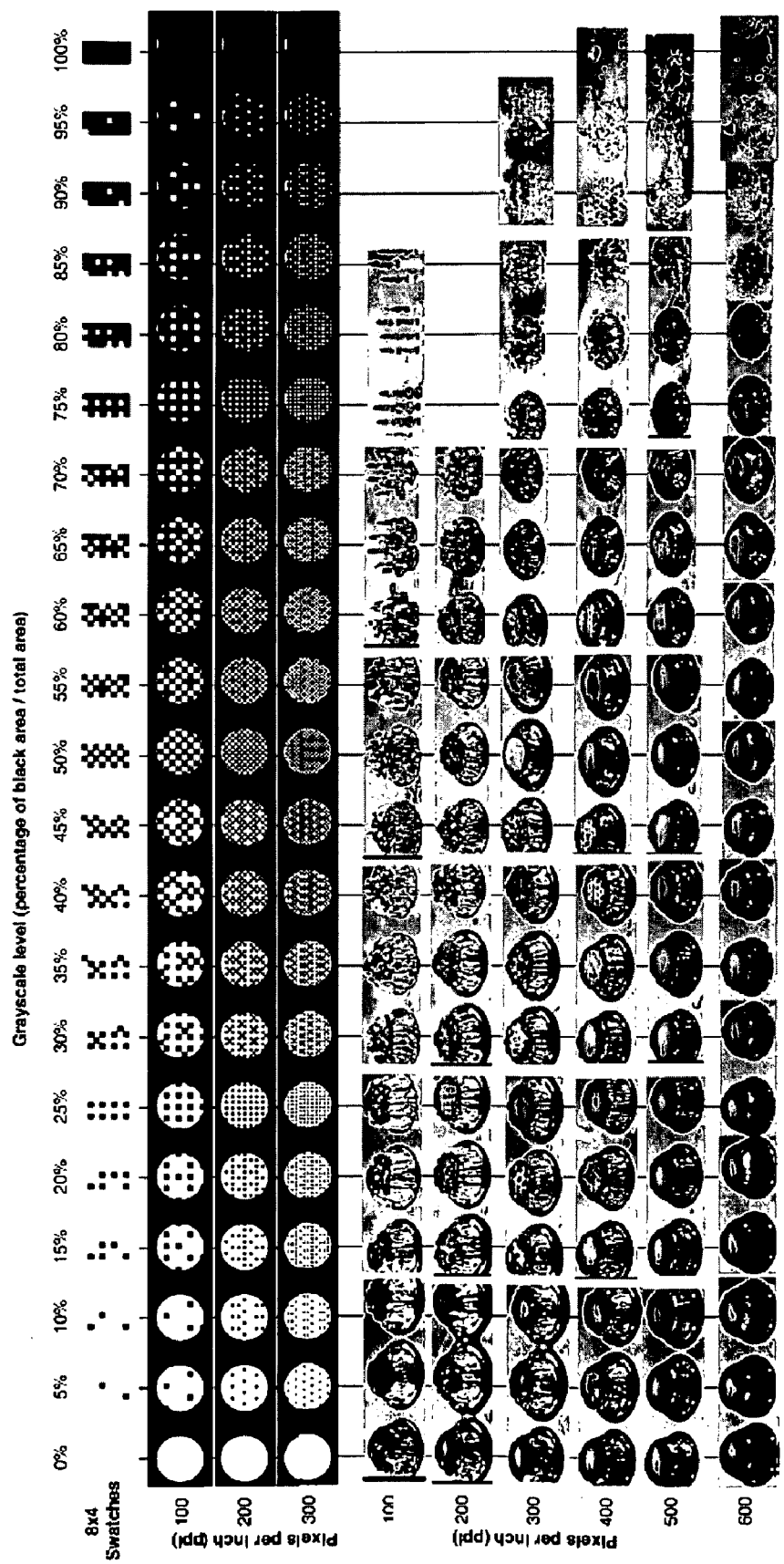
FIG. 28 is a diagram showing the various pixel patterns and swatches that may be used to develop various microstructures.
Figure 29:
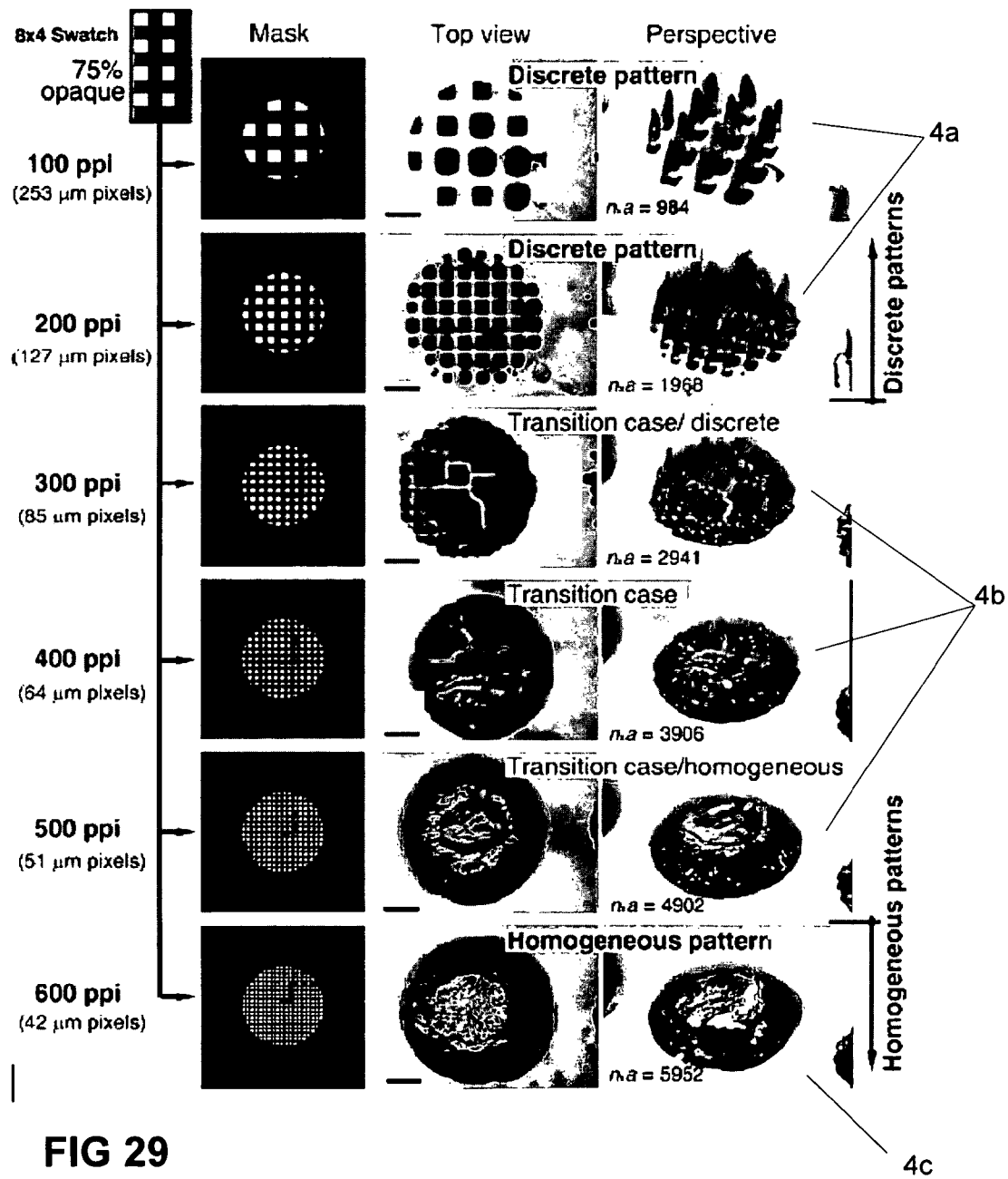
FIG. 29 is another diagram showing the various masks with pixel patterns that may be used to develop various microstructures.

As shown in FIGS. 28 and 29, various pixels of varying sizes may be used to create a wide variety of swatches and ultimately microstructures. FIG. 28 shows the results of various experiments that have been conducted to determine homogeneous/discrete patterns and their relation with the size and number of transparent pixels. Note that here first level swatches are used to pattern 32 grayscale pattern intensities ('tonalities'). Further, an array of grayscale binary masks of 2 mm circles are shown patterned with several grayscale tones. Swatches are also shown in the panels at different pixel sizes and densities, e.g., pixels per inch or ppi. The examples of thiolene polymerized patterns created with such masks are also shown.

FIG. 29 shows examples of the determination of a discrete pattern 4a, a transition case 4b, and a homogeneous pattern 4c in the case of 75% grayscale with varying ppi. It should be noted that n is the number of pixels per millimeter squared of pattern and a is the pixel size in micrometers.

Figure 30:
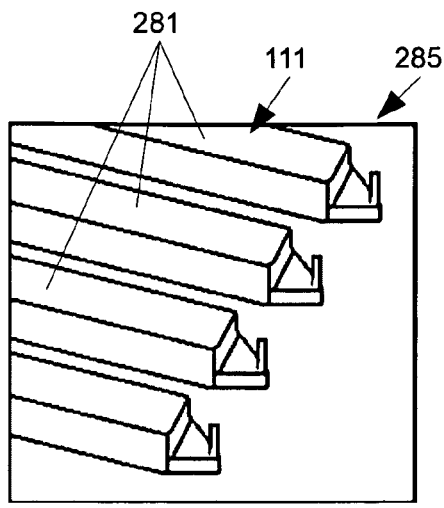
FIGS. 30 and 31 show a master template of a microstructure created from the method of the present invention.
Figure 31:
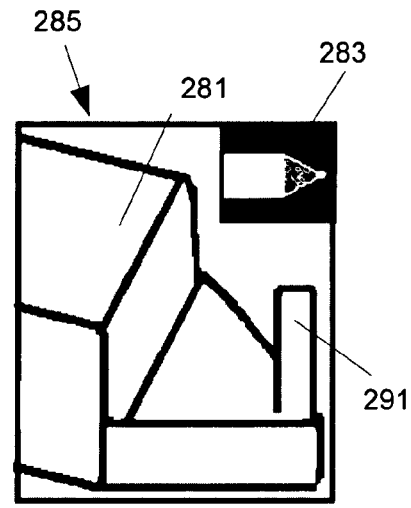
Figure 32:
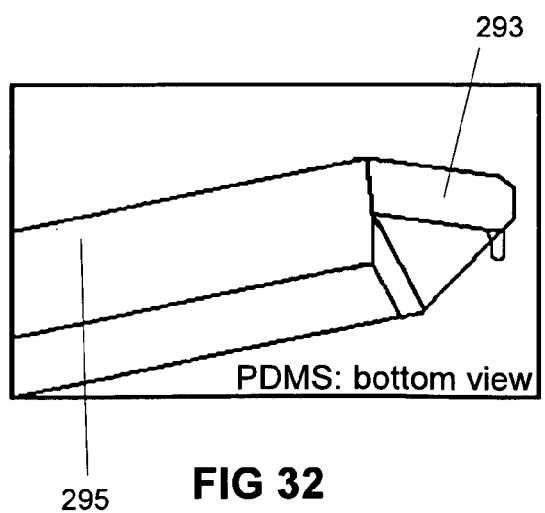
FIGS. 32 and 33 show replicas created from the template shown in FIGS. 30 and 31.
Figure 33:
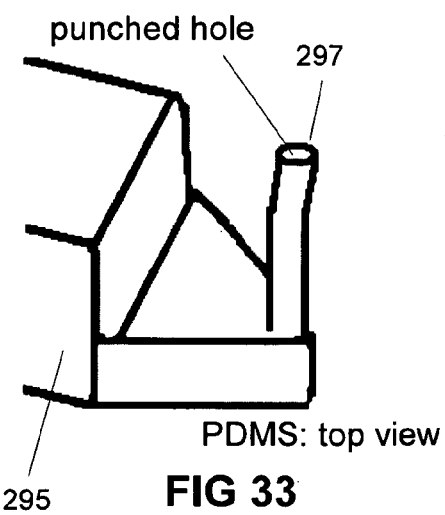

FIGS. 30-33, show yet another embodiment of a microfluidic device 111 of the present invention including various microstructures 281. FIGS. 30 and 31 show a master template of a microstructure and FIGS. 32-33 show replicas created from the template shown in FIGS. 30 and 31. The insert view in FIG. 31 shows a grayscale pattern 283 used to produce the microstructure 281. FIG. 30 shows a detail of the thiolene master pattern 285 showing the array of side microchannels 281. FIG. 31 shows a detail of an end of a side microchannel 281. The post 291 at the end of the micro channel 281 is used to create a cavity 293 on the PDMS replica 295. FIG. 32 shows a bottom view of a PDMS replica 295 created using the master 285. FIG. 33 shows that the previously discussed cavity may be used as a guide to introduce a thin metal tubing 297 and punch a small hole all the way through the PDMS and out to the exterior.

Figure 35:
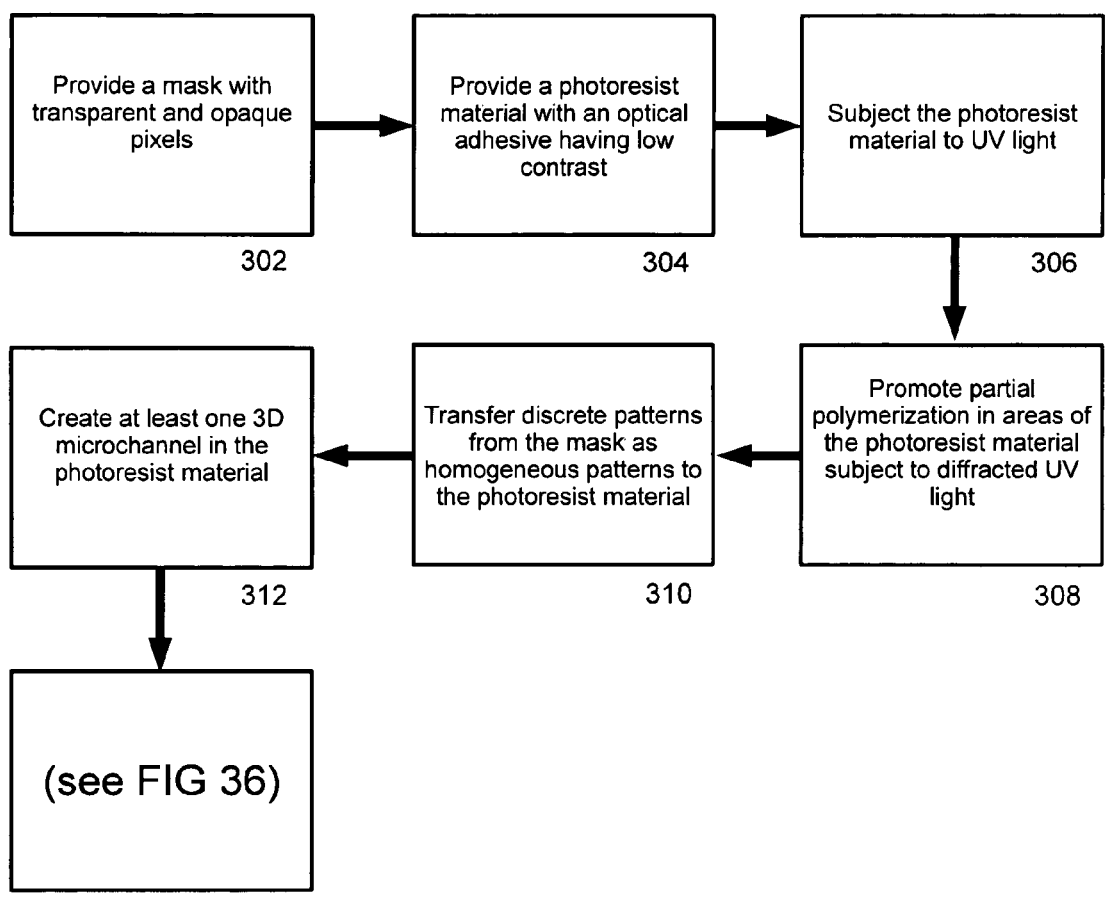
FIGS. 35-38 are flow charts illustrating the method of the present invention.
Figure 36:
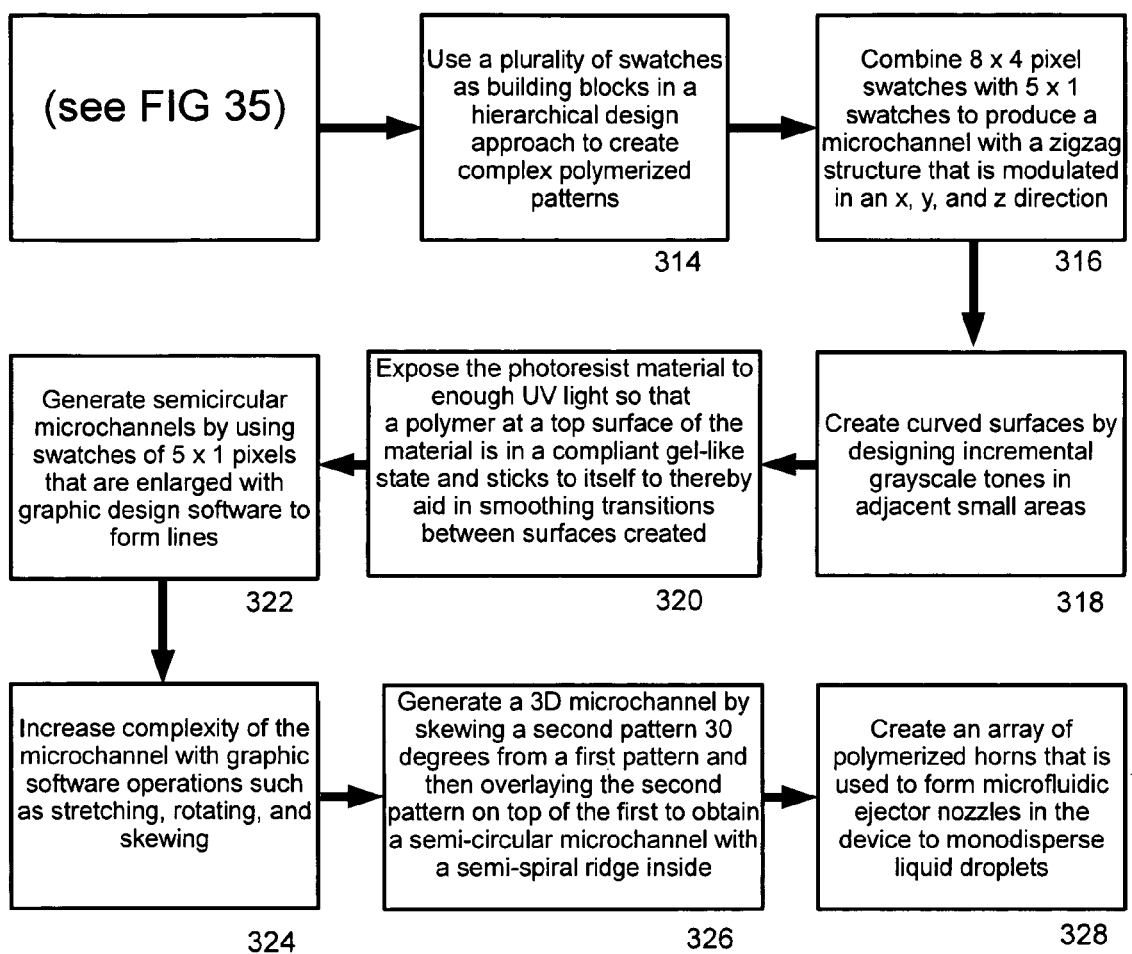

FIGS. 35 and 36 show one preferred method of fabrication of the present invention. Grayscale binary masks are first designed with Adobe Illustrator and printed at 3000 dpi and low density by media fusion, see www.mfiprepress.com. Two techniques can be used to create a first level grayscale pattern. The first uses a default grayscale binary pixelization setting where 8×4 pixel arrays are generated with increments of one black pixel until the entire array was black. Alternatively, customize arrays of 5×1 pixels can be created using a simple graphic software, such as Adobe Illustrator, to form lines and elongate the lines.

Corning 75 by 50 by 1 mm glass slides are used as substrates with the inventive method. One side of the glass slide is exposed to a UV source, such as a UV ozone cleaning system, for 20 minutes. Then, the slide is placed in conformal contact with a PDMS gasket containing a liquid adhesive such as Norland R-81. A transparent seam mask is then stacked between the other side of the glass slide and a second glass slide with a thin layer of DI (Deionized) water in between the masks and slides to improve the optical resolution. The UV exposure is performed with collimated light from an MA 8 mask aligner provided by Suss. When lower doses are required, an Omnicure series 2000 from Exfo can be used. Typical doses range from the 15 mW per centimeter squared for 8 seconds to 1.5 microwatts per centimeter squared for 500-900 seconds. Lower intensities allow for better control over the desired dose. After pre-cure, the uncrosslinked material is removed by first blowing with clean air followed by a three-step rinse with IPA, acetone, and then again with IPA to remove the acetone. A post-cure is completed with UV energy doses of approximately 12 Joules. PDMS replicas are then fabricated via the usual replica molding techniques. Holes in the PDMS replicas are punished with blunt syringe needles or metal tubing provided by Small Parts, Inc.

The horned array replica is created using a similar technique. First, the surface of the master is made hydrophobic to facilitate release of the replica later. This is done by sputtering layers of chrome, about 10 nm, and gold, about 100 nm, on the master. It is then placed in a vacuum container with an open vile containing the 15 microliters Heptadecafluoro -1,1,1,2, 2-tetra-hydrodecyl trichlorosilane (provided by Gelest) for 12 hours. The liquid adhesive is then poured over the master, and a thin PDMS membrane fixed to the glass slide is used to top the master with the liquid adhesive. Slight pressure is then applied to the glass slide so that the tips of the horns of the master are pressed into the PDMS, ensuring that holes are be formed at the tips. In the replica, these would form nozzles after curing. The PDMS membrane and replica is then peeled off. This homed array replica is then made Hydrophilic by coating its inner surface with a thin layer of gold to aid in filling. The atomizer is then assembled.

As shown in FIGS. 35 and 36, in one embodiment the method of the current invention comprises the steps of (302) providing a mask with transparent and opaque pixels; (304) providing a photoresist material with an optical adhesive having low contrast; (306) subjecting the photoresist material to UV light; (308) promoting partial polymerization in areas of the photoresist material subject to diffracted UV light; (310) transferring discrete patterns from the mask as homogeneous patterns to the photoresist material; and (312) creating at least one 3D microchannel in the photoresist material.

Further steps of the method shown in FIGS. 35 and 36 may include (314) using a plurality of swatches as building blocks in a hierarchical design approach to create complex polymerized patterns; (316) combining 8×4 pixel swatches with 5×1 swatches to produce a microchannel with a zigzag structure that is modulated in an x, y, and z direction; (318) creating curved surfaces by designing incremental grayscale tones in adjacent small areas; (320) exposing the photoresist material to enough UV light so that a polymer at a top surface of the material is in a compliant gel-like state and sticks to itself to thereby aid in smoothing transitions between surfaces created; (322) generating semicircular microchannels by using swatches of 5×1 pixels that are enlarged with graphic design software to form lines; (324) increasing complexity of the microchannel with graphic software operations such as stretching, rotating, and skewing; (326) generating a 3D microchannel by skewing a second pattern 30 degrees from a first pattern and then overlaying the second pattern on top of the first to obtain a semi-circular microchannel with a semi-spiral ridge inside; and (328) creating an array of polymerized horns that is used to form microfluidic ejector nozzles in the device to monodisperse liquid droplets.

Figure 37:
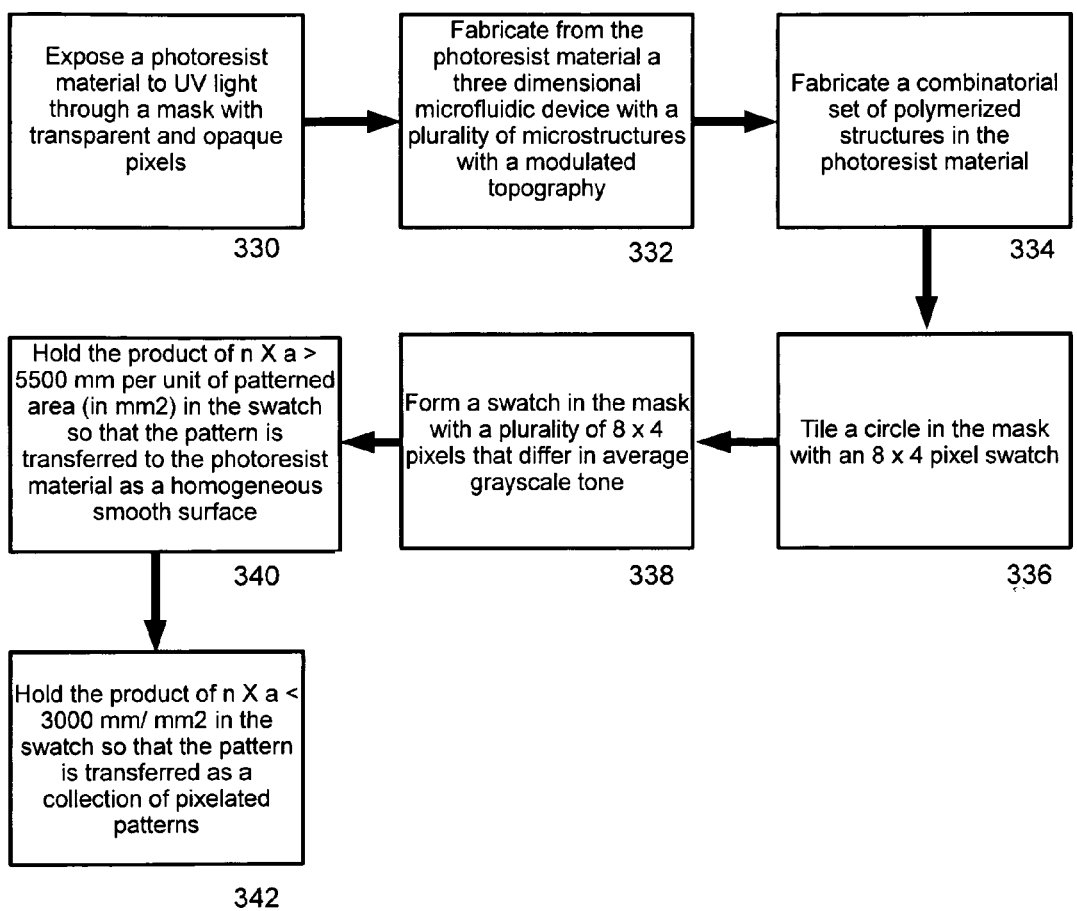
Figure 38:
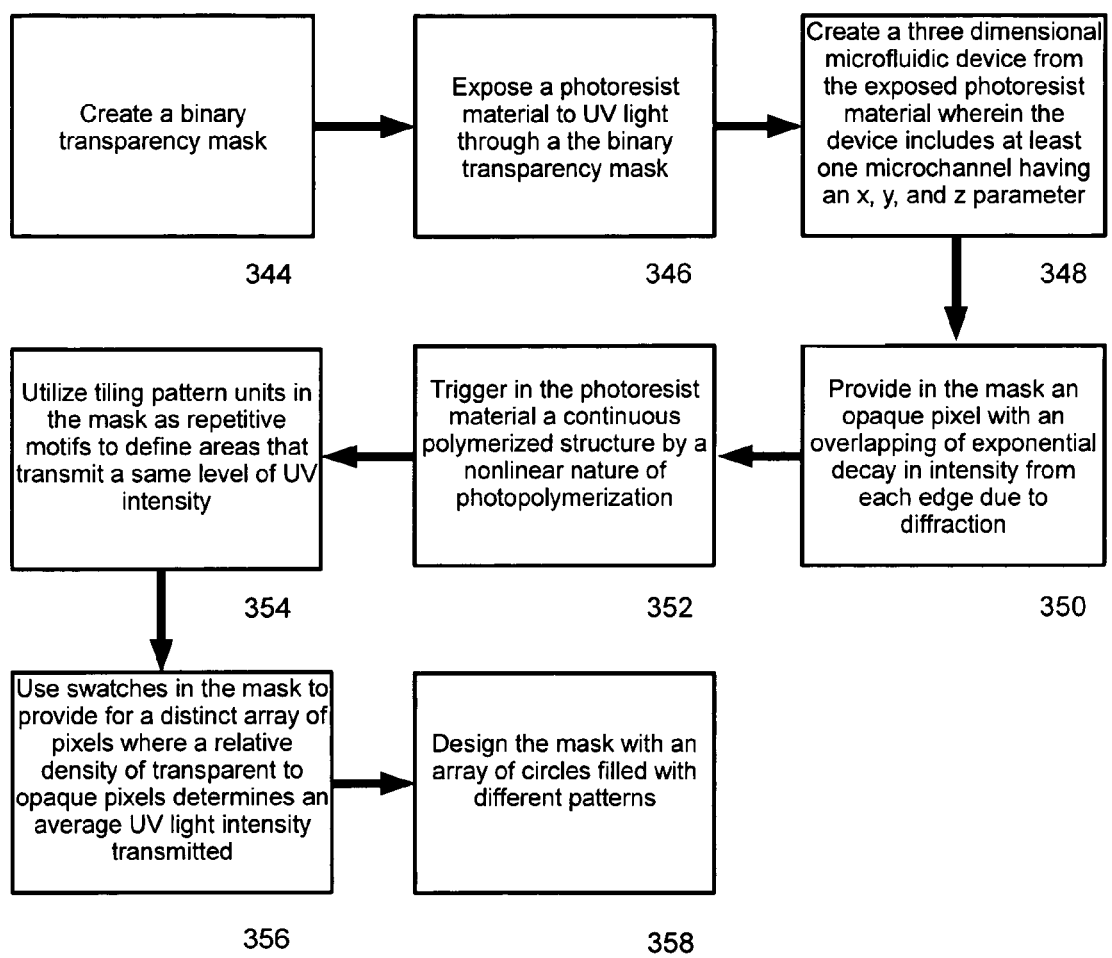

Additional fabrication methods, having slightly different steps, are shown in the flowcharts at FIGS. 37 and 38. Specifically, these steps are used to design and fabricate some the other structures discussed above.

As shown in FIG. 37, another embodiment the method of the current invention comprises (330) exposing a photoresist material to UV light through a mask with transparent and opaque pixels; and (332) fabricating from the photoresist material a three dimensional microfluidic device with a plurality of microstructures with a modulated topography.

Further steps of the method shown in FIG. 37 may include (334) fabricating a combinatorial set of polymerized structures in the photoresist material; (336) tiling a circle in the mask with an 8×4 pixel swatch; (338) forming a swatch in the mask with a plurality of 8×4 pixels that differ in average grayscale tone; (340) holding the product of n×a>5500 μm per unit of patterned area (in mm²) in the swatch so that the pattern is transferred to the photoresist material as a homogeneous smooth surface; and (342) holding the product of n×a<3000 μm/mm² in the swatch so that the pattern is transferred as a collection of pixelated patterns.

As shown in FIG. 38, another embodiment the method of the current invention comprises (344) creating a binary transparency mask; (346) exposing a photoresist material to UV light through a the binary transparency mask; and (348) creating a three dimensional microfluidic device from the exposed photoresist material wherein the device includes at least one microchannel having an x, y, and z parameter.

Further steps of the method shown in FIG. 38 may include (350) providing in the mask an opaque pixel with an overlapping of exponential decay in intensity from each edge due to diffraction; (352) triggering in the photoresist material a continuous polymerized structure by a nonlinear nature of photopolymerization; (354) utilizing tiling pattern units in the mask as repetitive motifs to define areas that transmit a same level of UV intensity; (356) using swatches in the mask to provide for a distinct array of pixels where a relative density of transparent to opaque pixels determines an average UV light intensity transmitted; and (358) designing the mask with an array of circles filled with different patterns.

There are virtually innumerable uses for the present invention, all of which need not be detailed here. Additionally, all the disclosed embodiments can be practiced without undue experimentation. Further, although the best mode contemplated by the inventors of carrying out the present invention is disclosed above, practice of the present invention is not limited thereto. It will be manifest that various additions, modifications, and rearrangements of the features of the present invention may be made without deviating from the spirit and scope of the underlying inventive concept.

In addition, the individual components of the present invention discussed herein need not be fabricated from the disclosed materials, but could be fabricated from virtually any suitable materials. Moreover, the individual components need not be formed in the disclosed shapes, or assembled in the disclosed configuration, but could be provided in virtually any shape, and assembled in virtually any configuration. Furthermore, all the disclosed features of each disclosed embodiment can be combined with, or substituted for, the disclosed features of every other disclosed embodiment except where such features are mutually exclusive.

Further, although the concept of pattern homogenization for the fabrication of 3D structures is shown and described here using a masking opaque/transparent motifs and UV light, the same concept could easily be used using infrared light (thermal radiation) and a thermal-resist instead of UV light and a photoresist. Another additional possibility would be using conventional lithography to create the motifs on a photoresist covering a silicon or glass wafer. The photoresist with the motifs would work as a mechanical mask for the fabrication of 3D structures on the wafers using wet or dry etching.

It is intended that the appended claims cover all such additions, modifications, and rearrangements. Expedient embodiments of the present invention are differentiated by the appended claims.

What is claimed is:

1. A method of fabricating comprising the steps of:
creating a binary transparency mask; exposing a photoresist material to UV light through the binary transparency mask while holding the product of n×a>5500 μm per unit of patterned area (in mm²) in the mask so that the pattern is transferred to the photoresist material as a homogeneous smooth surface, wherein n is the number of transparent pixels/mm² and a is a pixel length (μm); and creating a three dimensional microfluidic device from the exposed photoresist material; wherein the device includes at least one microchannel having an x, y, and z parameter.

2. The method of claim 1, further comprising the step of:
providing in the mask an opaque pixel with an overlapping of exponential decay in intensity from each edge due to diffraction.

3. The method of claim 1, further comprising the step of triggering in the photoresist material a continuous polymerized structure by a nonlinear nature of photopolymerization.

4. The method of claim 1, further comprising the step of utilizing tiling pattern units in the mask as repetitive motifs to define areas that transmit a same level of UV intensity.

5. The method of claim 1, further comprising the step of using swatches in the mask to provide for a distinct array of pixels where a relative density of transparent to opaque pixels determines an average UV light intensity transmitted.

6. The method of claim 1, further comprising the step of designing the mask with an array of circles filled with different patterns.

7. A method of fabricating a device comprising the steps of:
exposing a photoresist material to UV light through a mask with transparent and opaque pixels while holding the product of n×a>5500 μm per unit of patterned area (in mm²) in the mask, wherein n is the number of transparent pixels/mm² and a is a pixel length μm; and fabricating from the photoresist material a three dimensional microfluidic device with a plurality of microstructures with a modulated topography while inducing a homogenization effect.

8. The method of claim 7, further comprising the step of fabricating a combinatorial set of polymerized structures in the photoresist material.

9. The method of claim 7, further comprising the step of tiling a circle in the mask with an 8×4 pixel swatch.

10. The method of claim 7, further comprising the step of forming a swatch in the mask with a plurality of 8×4 pixels that differ in average grayscale tone.

11. A method of fabricating a device comprising the steps of: forming a swatch in a mask with a plurality of 8×4 pixels that differ in average grayscale tone; exposing a photoresist material to UV light through the mask with transparent and opaque pixels; holding the product of n×a>5500 μm per unit of patterned area (in mm$^2$) in the swatch so that the pattern is transferred to the photoresist material as a homogeneous smooth surface, wherein n is the number of transparent pixels/mm$^2$ and a is a pixel length (μm); and fabricating from the photoresist material a three dimensional microfluidic device with a plurality of microstructures with a modulated topography while inducing a homogenization effect.

12. A method of fabricating a device comprising the steps of: providing a mask with transparent and opaque pixels; providing a photoresist material with an optical adhesive having low contrast; subjecting the photoresist material to UV light; promoting partial polymerization in areas of the photoresist material subject to diffracted UV light; transferring discrete patterns from the mask as homogeneous patterns to the photoresist material while holding the product of n×a>5500 μm per unit of patterned area (in mm$^2$) in the mask, wherein n is the number of transparent pixels/mm$^2$ and a is a pixel length (μm); and creating at least one 3D microchannel in the photoresist material while inducing a homogenization effect.

13. The method of claim 12, further comprising the step of using a plurality of swatches as building blocks in a hierarchical design approach to create complex polymerized patterns.

14. The method of claim 12, further comprising the step of combining 8×4 pixel swatches with 5×1 swatches to produce a microchannel with a zigzag structure that is modulated in an x, y, and z direction.

15. The method of claim 12, further comprising the step of creating curved surfaces by designing incremental grayscale tones in adjacent small areas.

16. The method of claim 12, further comprising the step of exposing the photoresist material to enough UV light so that a polymer at a top surface of the material is in a compliant gel-like state and sticks to itself to thereby aid in smoothing transitions between surfaces created.

17. The method of claim 12, further comprising the step of generating semicircular microchannels by using swatches of 5×1 pixels that are enlarged with graphic design software to form lines.

18. The method of claim 12, further comprising the step of increasing complexity of the microchannel with graphic software operations such as stretching, rotating, and skewing.

19. The method of claim 12, further comprising the steps of:

generating a 3D microchannel by skewing a second pattern 30 degrees from a first pattern and then overlaying the second pattern on top of the first to obtain a semi-circular microchannel with a semi-spiral ridge inside; and creating an array of polymerized horns that is used to form microfluidic ejector nozzles in the device for creating monodisperse liquid droplets.

\* \* \* \* \*